(12) United States Patent
Arai et al.

(10) Patent No.: US 6,597,047 B2
(45) Date of Patent: Jul. 22, 2003

(54) METHOD FOR FABRICATING A NONVOLATILE SEMICONDUCTOR DEVICE

(75) Inventors: Masatoshi Arai, Nara (JP); Takahiko Hashidzume, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/813,305

(22) Filed: Mar. 21, 2001

(65) Prior Publication Data

US 2002/0019097 A1 Feb. 14, 2002

(30) Foreign Application Priority Data

Mar. 22, 2000 (JP) .......................... 2000-080539

(51) Int. Cl.[7] .......................... H01L 29/76; H01L 29/94
(52) U.S. Cl. .................. 257/411; 257/411; 257/324; 257/325; 438/216
(58) Field of Search ................ 257/324, 325, 257/410, 411; 438/305–307, 261, 257

(56) References Cited

U.S. PATENT DOCUMENTS 5,851,892 A * 12/1998 Lojek et al. ................ 438/305
5,885,870 A * 3/1999 Maiti et al. ................ 438/486
6,133,605 A * 10/2000 KIshi .......................... 257/325
6,191,463 B1 * 2/2001 Mitani et al. ............... 257/411

OTHER PUBLICATIONS

U. Sharma et al., "Vertically Scaled, High Reliability EEPROM Devices with Ultra–thin Oxynitride Films Prepared by RTP in $N_2O/O_2$ Ambient", IEDM 92, pp. 461–463.

* cited by examiner

Primary Examiner—Hoai Ho
Assistant Examiner—Dung A Le
(74) Attorney, Agent, or Firm—Nixon Peabody LLP; Donald R. Studebaker

(57) ABSTRACT

A silicon dioxide film, located over an active region in a well, is annealed at 1050° C. within an $N_2O$ ambient, thereby diffusing nitrogen into the silicon dioxide film and forming a nitrogen-containing silicon dioxide film. Next, two polysilicon films, interposing an ONO film therebetween, are deposited and then those films are patterned. In this manner, a memory gate electrode section, consisting of floating gate electrode, interelectrode insulating film and control gate electrode, is formed on the nitrogen-containing silicon dioxide film as a tunnel insulating film. At the same time, a select gate electrode section is also formed beside the memory gate electrode section. Then, p-type source/drain regions and intermediate diffused region are defined below these electrode sections. In this structure, electrons can be injected through a particular part of the tunnel insulating film and holes are trapped in a limited region of the tunnel insulating film.

7 Claims, 17 Drawing Sheets

FIG. 2A Program
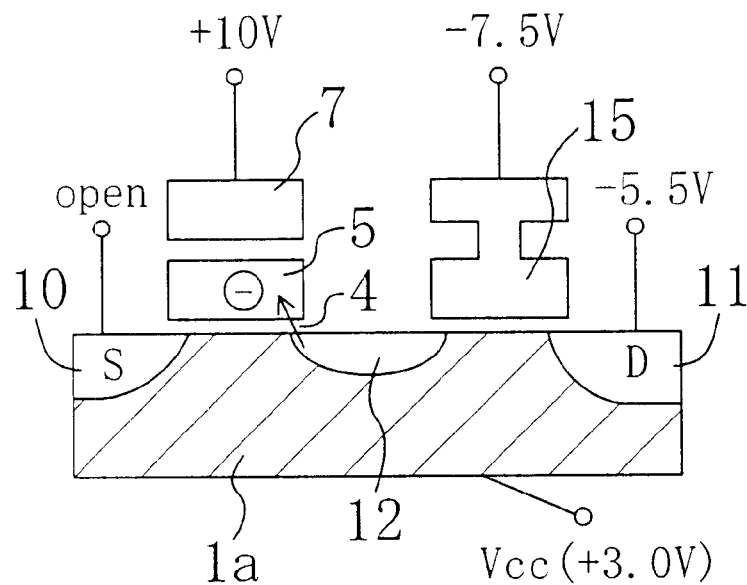
FIG. 2B Erase
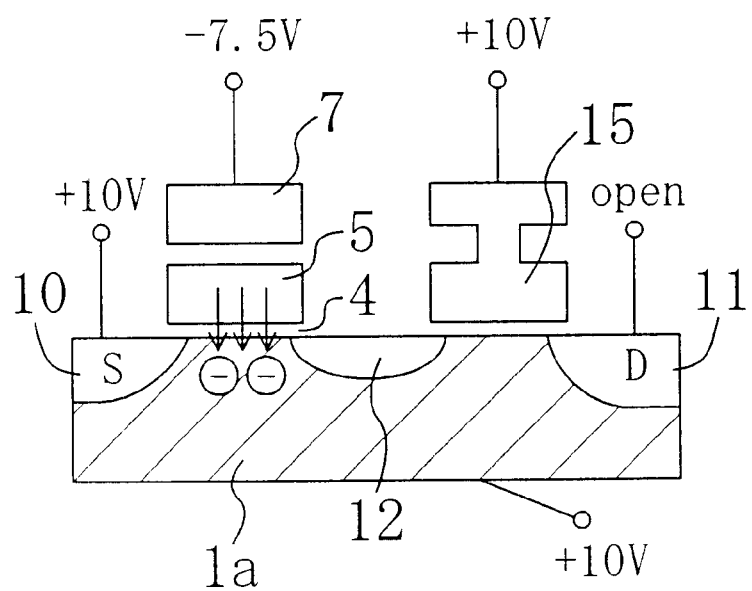

FIG. 4A Program
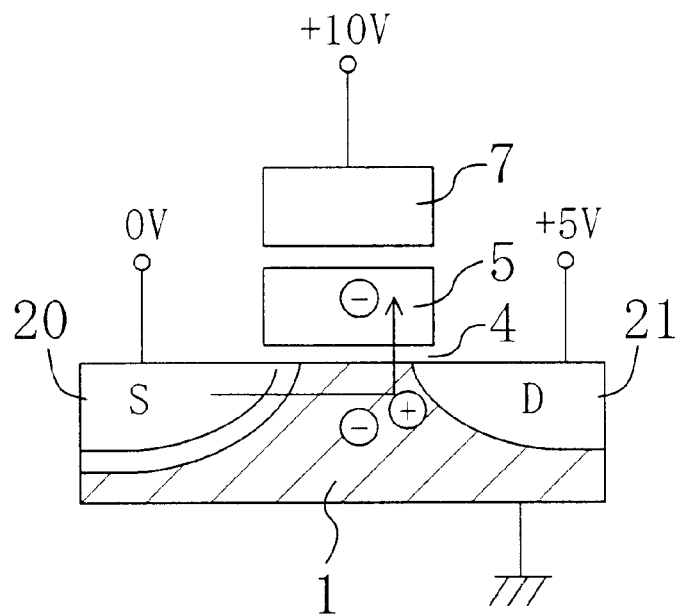
FIG. 4B Erase
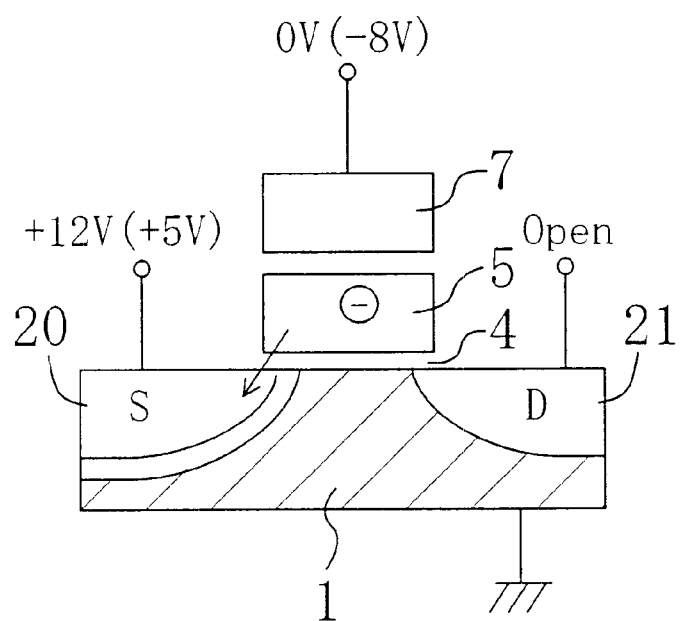

FIG. 6A Program
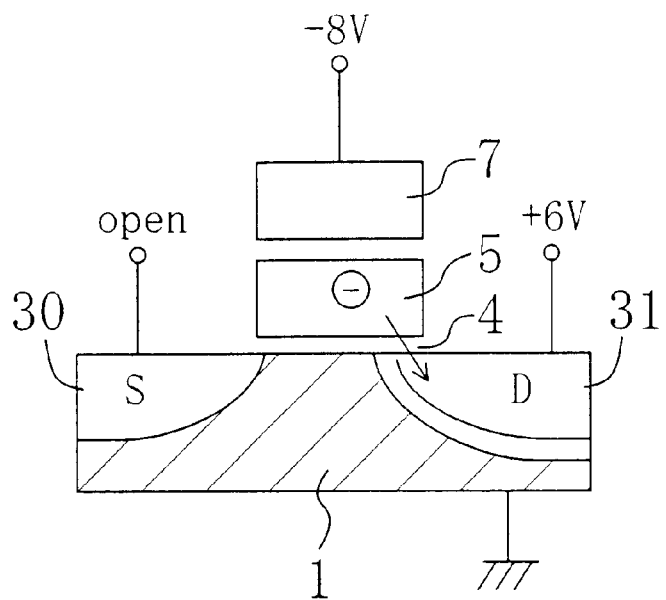
FIG. 6B Erase
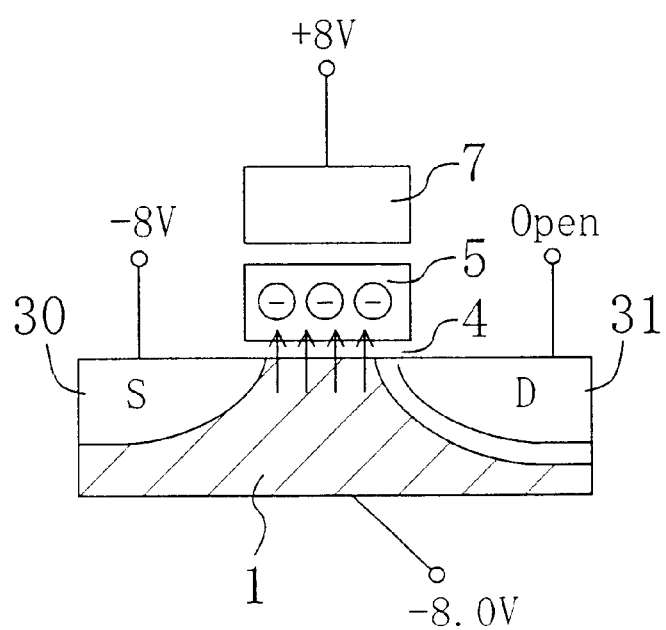

FIG. 9A Program
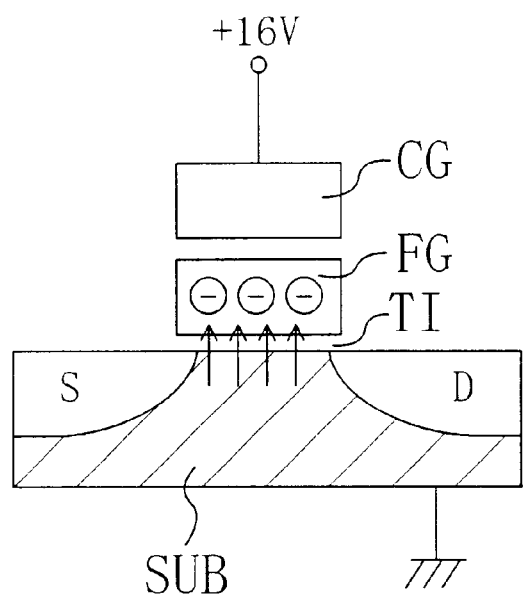
FIG. 9B Erase
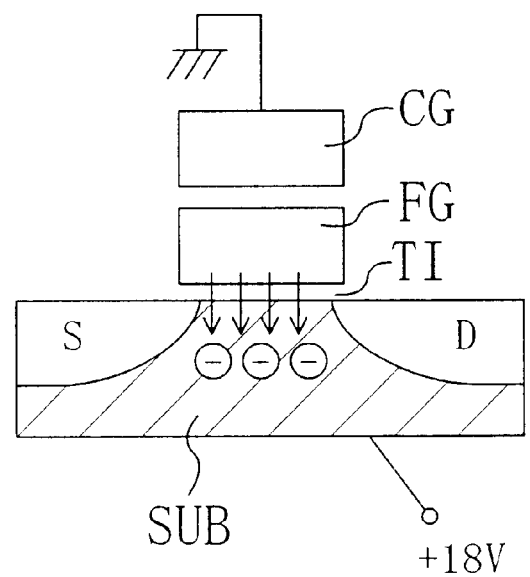

FIG. 10A Program
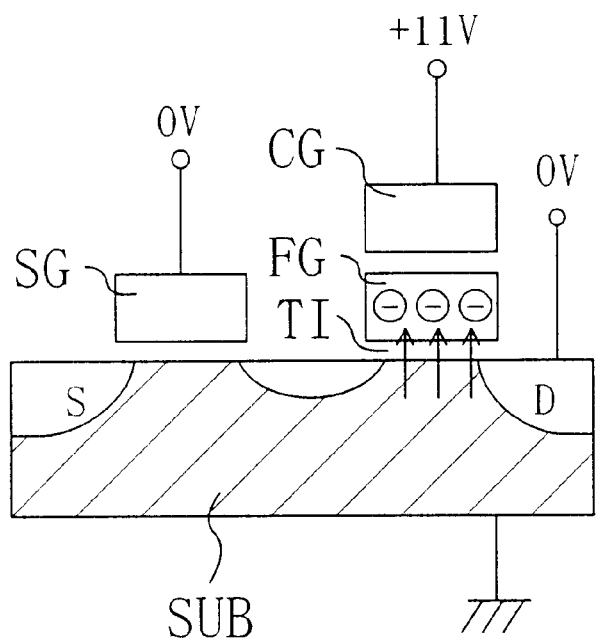
FIG. 10B Erase
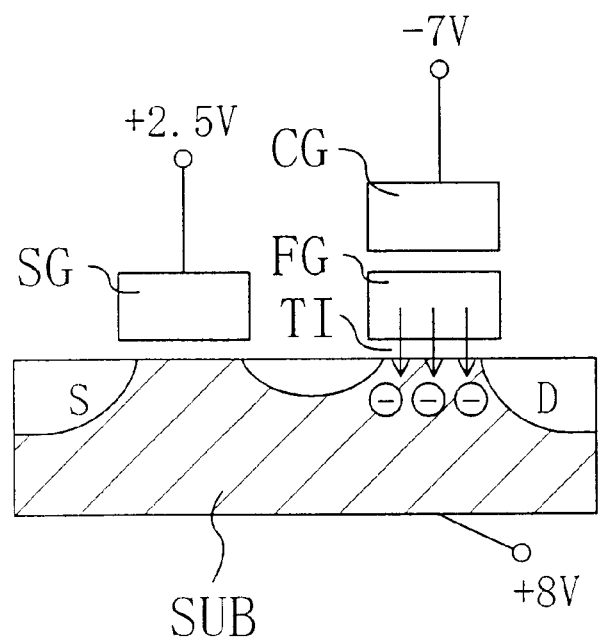

FIG. 11A Program
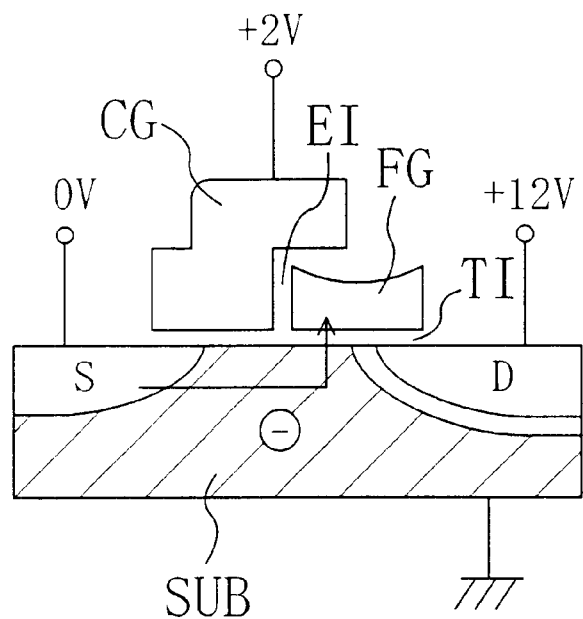
FIG. 11B Erase
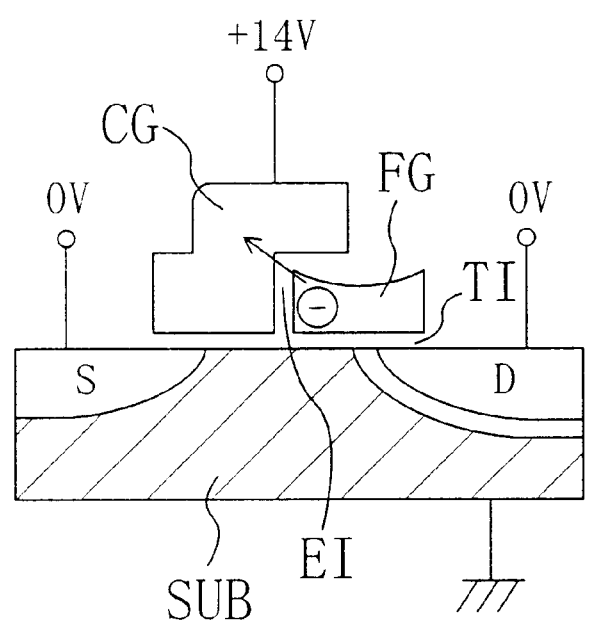

FIG. 12A Program
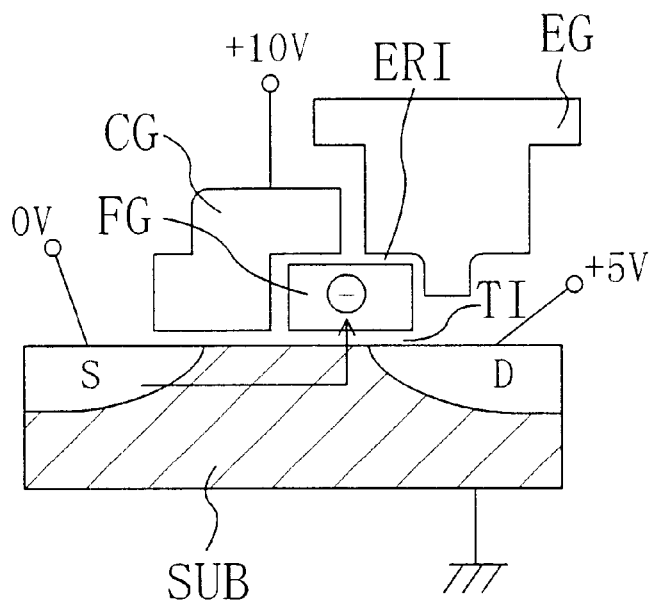
FIG. 12B Erase
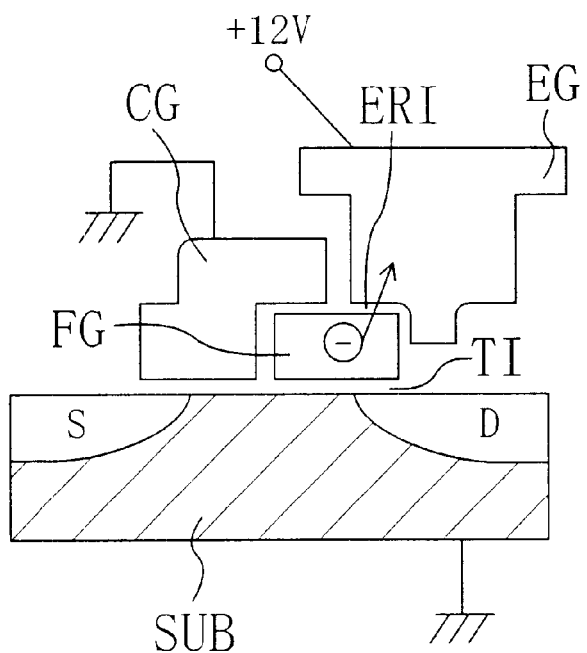

METHOD FOR FABRICATING A NONVOLATILE SEMICONDUCTOR DEVICE

BACKGROUND OF THE INVENTION

The present invention relates to a nonvolatile semiconductor memory device and a method for fabricating the device, and more particularly relates to measures to be taken to improve the reliability of a nonvolatile semiconductor memory device.

A known nonvolatile semiconductor memory device, like a flash EEPROM, typically has a structure in which a floating gate electrode for storing charge thereon is interposed between a control gate electrode, functioning as a gate electrode for an MIS transistor, and a channel region. Normally, information stored on the floating gate electrode can be read by determining the state of the MIS transistor as ON or OFF, which depends on whether there is any charge stored on the floating gate electrode or not. In a nonvolatile semiconductor memory device like this, information on the floating gate electrode is alterable by utilizing a charge tunneling phenomenon occurring in a tunnel insulating film located under the floating gate electrode. That is to say, the charge can be injected into, or removed from, the floating gate electrode by taking advantage of that tunneling phenomenon. A tunnel insulating film is usually an oxide film. However, it is already known empirically that the tunnel insulating film as a gate insulating film deteriorates with time, or through repetitive passage of charge through the tunnel insulating film. For that reason, various techniques have been proposed to improve the reliability of the tunnel insulating film.

Hereinafter, it will be described with reference to FIGS. 13A through 13D how the tunnel insulating film can have its reliability improved in a known nonvolatile semiconductor memory device.

First, in the process step shown in FIG. 13A, an isolation region 102 and an active region 103, surrounded by the isolation region 102, are defined in a p-type semiconductor substrate 101. Next, in the process step shown in FIG. 13B, a tunnel insulating film 104a is formed to a thickness of about 10 nm on the surface of the substrate 101. Then, in the process step shown in FIG. 13C, first polysilicon, ONO and second polysilicon films are stacked in this order over the substrate, and then patterned, along with the tunnel insulating film 104a, into a predetermined shape. In this manner, a gate electrode section 108, including floating gate electrode 105, interelectrode insulating film 106 and control gate electrode 107, is formed. As used herein, the "ONO film" is a multilayer structure consisting of oxide, nitride and oxide films that have been stacked one upon the other. Finally, in the process step shown in FIG. 13D, a sidewall 109 is formed on the side faces of the tunnel insulating film 104, floating gate electrode 105, interelectrode insulating film 106 and control gate electrode 107. Then, ions of an n-type dopant are implanted into the substrate 101 using the gate electrode section 108 and sidewall 109 as a mask, thereby defining n-type source/drain regions 110 and 111 in the substrate 101 on the right- and left-hand sides of the gate electrode section 108.

In the prior art, a write operation is performed by injecting electrons from the channel region, which is part of the substrate 101 located under the tunnel insulating film 104, into the floating gate electrode 105 by way of the tunnel insulating film 104. The electrons may be injected by utilizing an FN tunneling phenomenon, for example. On the other hand, the electrons can be removed from the floating gate electrode 105 into the channel region of the substrate 101. However, it is known that the greater the number of times the electrons pass through the tunnel insulating film 104 by the FN tunneling, the greater the number of defects (e.g., trap sites) created in the tunnel insulating film 104 and the less reliable the film 104 becomes. Thus, a proposed technique attempts to suppress the creation of defects such as trap sites by diffusing nitrogen atoms into the oxide film as the tunnel insulating film.

However, I found as a result of various experiments that even if nitrogen atoms are diffused into the tunnel insulating film, it is still difficult to suppress the degradation of the tunnel insulating film effectively. So I looked into the reasons to make the following findings.

Generally speaking, when nitrogen atoms are diffused into a silicon dioxide film (which is a thermal oxide film), the lower part of the tunnel insulating film closer to the substrate has its quality improved, whereas the upper part thereof closer to the floating gate electrode does not. This is because the nitrogen atoms exist at a relatively high density in the lower part of the tunnel insulating film near the interface with the substrate, while almost no nitrogen atoms exist in the upper part of the tunnel insulating film near the interface with the floating gate electrode.

In a known annealing process for forming a thermal oxide film, the oxide film is usually formed by a pyrolytic oxidation using oxygen and hydrogen gases. In an oxide film formed by the pyrolytic oxidation, a lot of oxygen atoms are contained. However, it is known that these oxygen atoms terminate dangling bonds included in the oxide film, thereby reducing a stress produced in the underlying semiconductor substrate and contributing to the performance enhancement of the resultant transistor. That is to say, it is known that a silicon dioxide film formed by the pyrolytic oxidation is much more reliable than a counterpart formed by a dry oxidation using oxygen gas only.

However, the experimental data I collected told me that while nitrogen atoms were being diffused into a thermal oxide film, hydrogen atoms, which had been introduced into the thermal oxide film by a pyrolytic oxidation process, might diffuse outward. This experimental data will be detailed later. And I believe that a tunnel insulating film, which has been subjected to the nitrogen diffusion process, has its quality degraded because hydrogen atoms, existing near the surface of the oxide film, diffuse outward to create charge trapping sites near the surface as a result of an annealing process at an elevated temperature. Hereinafter, it will be described how I believe the tunnel insulating film deteriorates.

FIG. 14 is a band diagram illustrating energy band structures for a cross section passing the floating gate electrode, tunnel insulating film and semiconductor substrate. Specifically, FIG. 14 illustrates how electrons are injected from the substrate into the floating gate electrode by way of the tunnel insulating film. As shown in FIG. 14, while electrons are injected from the substrate into the floating gate electrode by utilizing the FN tunneling, dangling bonds may exist in the upper part of the tunnel insulating film (i.e., a thermal oxide film where nitrogen atoms have been diffused) near the floating gate electrode. This is because hydrogen atoms may have diffused outward and may be absent from that part. In that case, holes may be trapped at those dangling bonds. In the lower part of the tunnel insulating film near the substrate on the other hand, nitrogen atoms exist at a relatively high density as described above.

Accordingly, it is believed that even if dangling bonds have been formed there due to the outward diffusion of hydrogen atoms, those dangling bonds are terminated with the nitrogen atoms and the probability of hole trapping is not so high there.

FIG. 15 is a band diagram illustrating energy band structures for a cross section passing the floating gate electrode, tunnel insulating film and semiconductor substrate. Specifically, FIG. 15 illustrates a state where holes have been trapped in the upper part of the tunnel insulating film near the floating gate electrode. As shown in FIG. 15, if holes have been trapped in the upper part of the tunnel insulating film, then the energy band structure of the tunnel insulating film changes so that the potential level locally drops in part of the conduction band of the tunnel insulating film. As a result, the charges (or electrons) stored on the floating gate electrode may easily leak out of the electrode into the substrate due to the tunneling phenomenon to decrease the reliability of the memory cell. For example, the data stored on the electrode might be lost partially. It should be noted that although some electrons are also trapped at the dangling bonds, but many other electrons widely exist all over the tunnel insulating film.

SUMMARY OF THE INVENTION

A general object of the present invention is clarifying the reason why the tunnel insulating film, or a thermal oxide film where nitrogen atoms have been diffused, has its reliability degraded and thereby providing means for suppressing such degradation effectively.

A more specific object of the invention is providing an improved nonvolatile semiconductor memory device as a memory cell with increased reliability by minimizing the decrease in charge retention capability of the floating gate electrode based on that finding.

Another object of the present invention is providing a method for fabricating the improved nonvolatile semiconductor memory device.

An inventive nonvolatile semiconductor memory device includes: a substrate including a semiconductor region; a tunnel insulating film, which is formed on the semiconductor region out of a silicon dioxide film containing nitrogen; a floating gate electrode formed on the tunnel insulating film; a control gate electrode capacitively coupled to the floating gate electrode; an interelectrode insulating film interposed between the floating and control gate electrodes; and two doped regions defined in the semiconductor region on right- and left-hand sides of the floating gate electrode. This device is constructed so that electrons are injected from a region, which is located near a boundary between one of the two doped regions and part of the semiconductor region under the tunnel insulating film, into the floating gate electrode after having been tunneled through the tunnel insulating film.

According to the present invention, electrons are injected into the floating gate electrode through a particular part of the tunnel insulating film. Thus, even if holes have been trapped at charge trapping sites in that local region, the quantity of charge leaking out of the floating gate electrode hardly increases. As a result, should those charge trapping sites have been newly created due to the outward diffusion of hydrogen atoms in the nitrogen-containing silicon dioxide film, the decrease in the charge retention capability of the floating gate electrode can be minimized.

In one embodiment of the present invention, the semiconductor region may be an n-type semiconductor region, and the two doped regions may be p-type doped regions. In that case, the device is preferably so constructed that the electrons are injected into the floating gate electrode as hot electrons that have been created by a band-to-band tunneling current flowing from the n-type semiconductor region into one of the p-type doped regions. Then, the method of injecting hot electrons created by a band-to-band tunneling current can be made full use of. Specifically, threshold voltages for write and erase operations can be greatly different, data is alterable a greater number of times and writing can be performed in a short time. In addition, should charge trapping sites have been newly created, the decrease in the charge retention capability of the floating gate electrode can be minimized.

In an alternative embodiment, the semiconductor region may be a p-type semiconductor region, and the two doped regions may be n-type doped regions. In that case, the device is preferably so constructed that the electrons are injected into the floating gate electrode as channel hot electrons. In such an embodiment, the channel hot electron injection method can be made full use of. Specifically, a control circuit can be simplified, for example. In addition, should charge trapping sites have been newly created, the decrease in the charge retention capability of the floating gate electrode can be minimized.

A first inventive method for fabricating a nonvolatile semiconductor memory device includes the steps of: a) forming a silicon dioxide film on an n-type semiconductor region by performing an annealing process within an ambient containing oxygen and hydrogen, the n-type semiconductor region being located in a substrate; b) diffusing nitrogen into the silicon dioxide film by annealing the silicon dioxide film within an ambient containing nitrogen; c) forming a memory gate electrode section, which includes a floating gate electrode, an interelectrode insulating film and a control gate electrode, on the silicon dioxide film after the step b) has been performed; and d) defining two p-type doped regions by introducing a p-type dopant into two parts of the n-type semiconductor region that are located on right- and left-hand sides of the floating gate electrode.

According to the first inventive method, while nitrogen is being diffused in the step b), hydrogen is released out of the silicon dioxide film. As a result, charge trapping sites are newly created in the silicon dioxide film, which functions as a tunnel insulating film under the floating gate electrode. However, by using the hot electrons that have been created by a band-to-band tunneling current flowing from the n-type semiconductor region into one of the p-type doped regions, the electrons can be injected through a particular part of the tunnel insulating film into the floating gate electrode. Accordingly, a nonvolatile semiconductor memory device, in which threshold voltages for write and erase operations can be greatly different and data is alterable a greater number of times and can be written in a short time and which includes a floating gate electrode with increased charge retention capability, can be obtained.

A second inventive method for fabricating a nonvolatile semiconductor memory device includes the steps of: a) forming a silicon dioxide film on a p-type semiconductor region by performing an annealing process within an ambient containing oxygen and hydrogen, the p-type semiconductor region being located in a substrate; b) diffusing nitrogen into the silicon dioxide film by annealing the silicon dioxide film within an ambient containing nitrogen; c) forming a memory gate electrode section, which includes a floating gate electrode, an interelectrode insulating film and a control gate electrode, on the silicon dioxide film after the step b) has been performed; and d) defining two n-type doped regions by introducing an n-type dopant into two parts of the p-type semiconductor region that are located on right- and left-hand sides of the floating gate electrode. A dopant profile in a transition region between the p-type semiconductor region and one of the n-type doped regions is different from a dopant profile in a transition region between the p-type semiconductor region and the other n-type doped region.

According to the second inventive method, while nitrogen is being diffused in the step b), hydrogen is released out of the silicon dioxide film. As a result, charge trapping sites are newly created in the silicon dioxide film, which functions as a tunnel insulating film under the floating gate electrode. However, according to this method, channel hot electrons, which are created in a boundary region near one of the two n-type doped regions that has the steeper dopant profile when a channel current flows between the two n-type regions, are used. And by using these channel hot electrons, the electrons can be injected through a particular part of the tunnel insulating film into the floating gate electrode. Accordingly, a nonvolatile semiconductor memory device, in which the control circuit can be simplified and which includes a floating gate electrode with increased charge retention capability, can be obtained.

A third inventive method for fabricating a nonvolatile semiconductor memory device includes the steps of: a) forming a silicon dioxide film on a semiconductor region by performing an annealing process within an ambient containing oxygen and hydrogen, the semiconductor region being located in a substrate; b) diffusing nitrogen into the silicon dioxide film by annealing the silicon dioxide film at a temperature between 800° C. and 950° C. within an ambient containing nitrogen; c) forming a memory gate electrode section, which includes a floating gate electrode, an interelectrode insulating film and a control gate electrode, on the silicon dioxide film after the step b) has been performed; and d) defining two doped regions by introducing a dopant into two parts of the semiconductor region that are located on right- and left-hand sides of the floating gate electrode. The doped regions have a conductivity type opposite to that of the semiconductor region.

According to the third inventive method, while nitrogen is being diffused in the step b), the release of hydrogen from the silicon dioxide film is suppressible. Thus, the creation of new charge trapping sites can be minimized and the silicon dioxide film can function as a tunnel insulating film under the floating gate electrode. As a result, a nonvolatile semiconductor memory device, including a floating gate electrode with increased charge retention capability, can be obtained.

A fourth inventive method for fabricating a nonvolatile semiconductor memory device includes the steps of: a) forming a silicon dioxide film on a semiconductor region by performing an annealing process within an ambient containing oxygen and hydrogen, the semiconductor region being located in a substrate; b) diffusing at least one of hydrogen and fluorine into the silicon dioxide film by annealing the silicon dioxide film within an ambient containing hydrogen and/or fluorine; c) forming a memory gate electrode section, which includes a floating gate electrode, an interelectrode insulating film and a control gate electrode, on the silicon dioxide film after the step b) has been performed; and d) defining two doped regions by introducing a dopant into two parts of the semiconductor region that are located on right- and left-hand sides of the floating gate electrode. The doped regions have a conductivity type opposite to that of the semiconductor region.

According to the fourth inventive method, hydrogen and/or fluorine is/are diffused in the step b). Thus, the number of charge trapping sites in the silicon dioxide film can be reduced and the silicon dioxide film can function as a tunnel insulating film under the floating gate electrode. As a result, a nonvolatile semiconductor memory device, in which a decreased quantity of charge leaks out of the tunnel insulating film and which includes a floating gate electrode with increased charge retention capability, can be obtained.

In one embodiment of the present invention, the fourth method may further include the step of diffusing nitrogen into the silicon dioxide film by annealing the silicon dioxide film within an ambient containing nitrogen between the steps a) and c). In such an embodiment, the silicon dioxide film, into which nitrogen has been diffused, functions as a tunnel insulating film under the floating gate electrode. Accordingly, a highly reliable tunnel insulating film, in which a much smaller number of defects are created even if electrons have been removed from the floating gate electrode many times, can be obtained. As a result, a nonvolatile semiconductor memory device, including a much more reliable tunnel insulating film, can be obtained.

In another embodiment, the silicon dioxide film is preferably annealed in the step b) at a temperature between 300° C. and 950° C.

A fifth inventive method for fabricating a nonvolatile semiconductor memory device includes the steps of: a) forming a silicon dioxide film on a semiconductor region by performing an annealing process within an ambient containing oxygen and hydrogen, the semiconductor region being located in a substrate; b) diffusing nitrogen into the vicinity of an interface between the silicon dioxide film and the substrate by annealing the silicon dioxide film at a temperature between 800° C. and 1200° C. within an ambient containing nitrogen; c) diffusing nitrogen into a surface region of the silicon dioxide film by annealing the silicon dioxide film at a temperature between 300° C. and 800° C. within an ambient containing nitrogen radicals; d) forming a memory gate electrode section, which includes a floating gate electrode, an interelectrode insulating film and a control gate electrode, on the silicon dioxide film after the step c) has been performed; and e) defining two doped regions by introducing a dopant into two parts of the semiconductor region that are located on right- and left-hand sides of the floating gate electrode. The doped regions have a conductivity type opposite to that of the semiconductor region.

According to the fifth inventive method, nitrogen is diffused into not only around the interface between the silicon dioxide film and substrate but also the surface region of the silicon dioxide film. Thus, the number of holes trapped in the surface region of the silicon dioxide film can be reduced drastically, and the silicon dioxide film can function as a tunnel insulating film under the floating gate electrode. As a result, a nonvolatile semiconductor memory device, in which an even smaller quantity of charge leaks out of the silicon dioxide film as the tunnel insulating film and which includes a much more reliable tunnel insulating film, can be obtained.

BRIEF DESCRIPTION OF THE DRAWINGS

FIGS. 2A and 2B are cross-sectional views illustrating how to write or erase data on/from the memory cell of the first embodiment.

FIGS. 4A and 4B are cross-sectional views illustrating how to write or erase data on/from the memory cell of the second embodiment.

FIGS. 6A and 6B are cross-sectional views illustrating how to write or erase data on/from the memory cell of the third embodiment.

FIGS. 9A and 9B are cross-sectional views illustrating a structure for a nonvolatile semiconductor memory device (or memory cell) according to a fifth embodiment of the present invention and how to write or erase data on/from the memory cell.

FIGS. 10A and 10B are cross-sectional views illustrating a structure for a nonvolatile semiconductor memory device (or memory cell) according to a sixth embodiment of the present invention and how to write or erase data on/from the memory cell.

FIGS. 11A and 11B are cross-sectional views illustrating a structure for a nonvolatile semiconductor memory device (or memory cell) according to a seventh embodiment of the present invention and how to write or erase data on/from the memory cell.

FIGS. 12A and 12B are cross-sectional views illustrating a structure for a nonvolatile semiconductor memory device (or memory cell) according to an eighth embodiment of the present invention and how to write or erase data on/from the memory cell.

DESCRIPTION OF THE PREFERRED EMBODIMENTS

Hereinafter, preferred embodiments of the inventive nonvolatile semiconductor memory device will be described with reference to the accompanying drawings.

Embodiment 1

FIGS. 1A through 1E are cross-sectional views illustrating respective process steps for fabricating a nonvolatile semiconductor memory device (or memory cell) according to a first embodiment of the present invention.

Figure 1A:
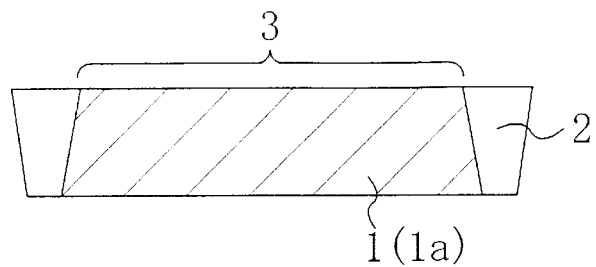
FIGS. 1A through 1E are cross-sectional views illustrating respective process steps for fabricating a nonvolatile semiconductor memory device (or memory cell) according to a first embodiment of the present invention.

First, in the process step shown in FIG. 1A, an n-well 1a is defined in a silicon substrate 1 containing a p-type dopant by implanting ions of an n-type dopant thereto, for example. And an isolation region 2 is formed in the n-well 1a to define an active region 3 in which a memory cell will be formed.

Figure 1B:
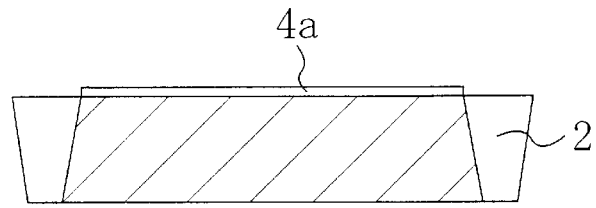

Next, in the process step shown in FIG. 1B, the surface of the active region 3 is oxidized by a known pyrolytic oxidation process, thereby forming a silicon dioxide film 4a with a thickness of about 7 nm.

Figure 1C:
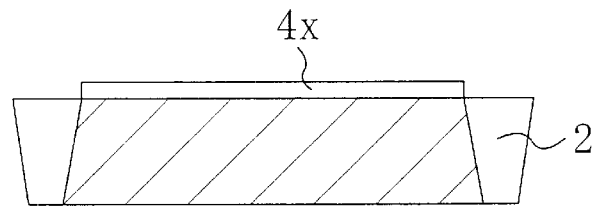

Subsequently, in the process step shown in FIG. 1C, the silicon dioxide film 4a is subjected to a lamp annealing process at 1050° C. within an $N_2O$ ambient, thereby introducing and diffusing nitrogen into the silicon dioxide film 4a and increasing the thickness of the silicon dioxide film 4a to 10 nm. In this manner, a nitrogen-containing silicon dioxide film 4x with a thickness of 10 nm is formed. At this time, nitrogen is non-uniformly distributed in the nitrogen-containing silicon dioxide film 4x so that the lower part of the film 4x near the n-well 1a has a relatively high nitrogen density.

Figure 1D:
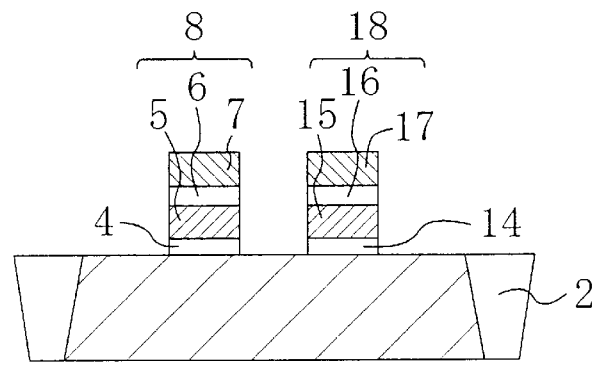

Then, in the process step shown in FIG. 1D, first polysilicon, ONO (i.e., a multilayer structure consisting of silicon dioxide, silicon nitride and silicon dioxide films) and second polysilicon films are stacked in this order on the nitrogen-containing silicon dioxide film 4x. Thereafter, a resist mask is defined thereon by a photolithographic process and then the second polysilicon, ONO, first polysilicon and nitrogen-containing silicon dioxide films are dry-etched and patterned in this order using the mask. In this manner, tunnel insulating film 4, floating gate electrode 5, interelectrode insulating film 6 of ONO and control gate electrode 7 are formed. As a result of this process step, a memory gate electrode section 8, consisting of the floating gate electrode 5, interelectrode insulating film 6 and control gate electrode 7, is formed on the tunnel insulating film 4. Also, gate insulating film 14, select gate electrode 15, dummy interelectrode insulating film 16 and dummy control gate electrode 17 are formed beside the memory gate electrode section 8. As a result of this process step, a select gate electrode section 18, consisting of the select gate electrode 15, dummy interelectrode insulating film 16 and dummy control gate electrode 17, is formed on the gate insulating film 14. The select gate electrode 15 and dummy control gate electrode 17 are partially short-circuited so as to establish electrical continuity between them. Accordingly, when a voltage is applied to the dummy control gate electrode 17, the voltage is directly applied to the select gate electrode 15.

Figure 1E:
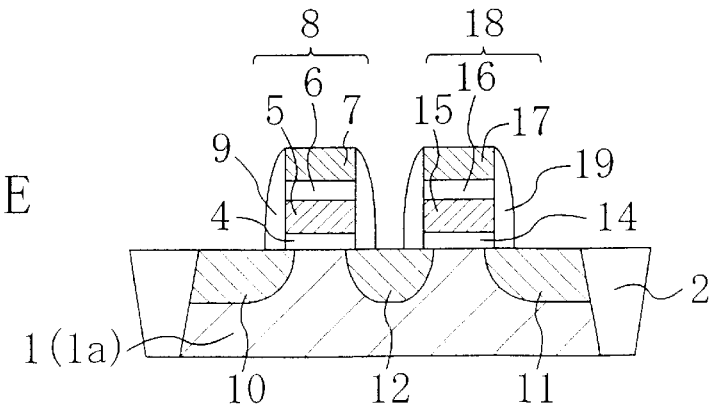

Subsequently, in the process step shown in FIG. 1E, sidewalls 9 and 19, each having a thickness of about 100 nm, are formed on the side faces of the memory and select gate electrodes sections 8 and 18. Thereafter, using the memory and select gate electrode sections 8 and 18 and the sidewalls 9 and 19 as a mask, ions of a p-type dopant are implanted into the n-well 1a. In this manner, p-type source/drain regions 10 and 11 and p-type intermediate doped region 12 are defined in parts of the n-well 1a on the left-hand side of the floating gate electrode 5, on the right-hand side of the select gate electrode 15 and between the floating and select gate electrodes 5 and 15, respectively.

FIGS. 2A and 2B are cross-sectional views illustrating how to write and erase data on/from the memory cell of the first embodiment.

As shown in FIG. 2A, in performing a write (i.e., program) operation on this memory cell, the p-type source region 10 may be opened. And negative intermediate voltage of −5.5 V, negative large voltage of −7.5 V, positive high voltage of +10 V and positive low voltage Vcc of +3.0 V may be applied to the p-type drain region 11, select gate electrode 15, control gate electrode 7 and n-well 1a, respectively. By applying these voltages, a pn junction between the n-well 1a and p-type intermediate diffused region 12 sharpens. As a result, holes move at a high velocity from the n-well 1a into the p-type intermediate diffused region 12, because a band-to-band tunneling current flows between them. In the meantime, the holes moving collide against electrons existing in a depletion layer (located around a boundary between the n-well 1a and intermediate diffused region 12) to create hot electrons. Then, the hot electrons, created by the band-to-band tunneling current, are attracted toward the floating gate electrode 5, which is capacitively coupled to the control gate electrode 7. Thereafter, the electrons are tunneled through part of the tunnel insulating film 4 near the p-type intermediate diffused region 12 and then injected into the floating gate electrode 5. Programming is realized in this manner.

On the other hand, in performing an erase operation on this memory cell, the p-type drain region 11 may be opened as shown in FIG. 2B. Also, positive high voltage of +10 V, positive high voltage of +10 V, negative large voltage of −7.5 V and positive high voltage of +10 V may be applied to the p-type source region 10, select gate electrode 15, control gate electrode 7 and n-well 1a, respectively. By applying these voltages, electrons, existing in the floating gate electrode 5, are attracted toward the n-well 1a at the positive high potential level, tunneled through the entire tunnel insulating film 4 and removed out of the electrode 5 into the n-well 1a. Erasing is realized in this manner.

In the nonvolatile semiconductor memory device (or memory cell) of the first embodiment, nitrogen, which has been diffused into the tunnel insulating film 4, is non-uniformly distributed so that the nitrogen density is relatively high in the lower part of the tunnel insulating film 4 closer to the n-well 1a. Accordingly, that lower part of the tunnel insulating film 4 has high film quality. For that reason, while the electrons are being tunneled from the floating gate electrode 5 through almost the entire tunnel insulating film 4, the creation of defects in the lower part of the tunnel insulating film 4 near the n-well 1a can be suppressed.

In the upper part of the tunnel insulating film 4 closer to the floating gate electrode 5, charge trapping sites are newly formed because hydrogen diffuses outward as in the known nonvolatile semiconductor memory device. However, in the memory cell of the first embodiment, hot electrons, which are created in the region near the boundary between the n-well 1a and p-type intermediate diffused region 12 by the band-to-band tunneling current during writing, pass through only a particular part of the tunnel insulating film 4 near the p-type intermediate diffused region 12. Accordingly, holes are trapped at the charge trapping sites only in the particular part of the tunnel insulating film 4 near the p-type intermediate diffused region 12 during the tunneling. That is to say, the area of that particular part of the tunnel insulating film 4 where holes are trapped is much smaller than the total area of the interface between the tunnel insulating film 4 and floating gate electrode 5. Thus, a very small quantity of electrons leaks out of the sites with the deformed band structure after holes have been trapped at the charge trapping sites. As a result, the nonvolatile semiconductor memory device (or memory cell) of the first embodiment can take advantage of the features of the method of injecting hot electrons created by a band-to-band tunneling current. Specifically, threshold voltages for write and erase operations can be greatly different, data is alterable a greater number of times and writing can be performed in a short time. In addition, should charge trapping sites have been newly created, the decrease in the charge retention capability of the floating gate electrode 5 can be minimized.

Also, according to the fabrication process of the first embodiment, a lamp annealing process (i.e., a rapid heating and cooling process using a halogen lamp, for example) is adopted to diffuse nitrogen into the tunnel insulating film 4. Thus, the annealing can be performed rapidly enough and nitrogen can be diffused while keeping the dopant profile in the n-well 1a as it is. As a result, variation in threshold voltage can be suppressed.

It should be noted that the select gate electrode 15 may be omitted according to the first embodiment. In that case, hot electrons, created in a boundary between the p-type drain region 11 and the n-well 1a by the band-to-band tunneling current, pass through a particular part of the tunnel insulating film 4 near the p-type drain region 11 and are injected into the floating gate electrode 5. Accordingly, the effects of the first embodiment are also attainable.

Also, the writing method shown in FIG. 2A may be modified in such a manner that the p-type drain region 11 is opened and that a negative voltage of −5.5 V is applied to the p-type source region 10. In that case, hot electrons, created in a boundary between the p-type source region 10 and the n-well 1a by the band-to-band tunneling current, pass through a particular part of the tunnel insulating film 4 near the p-type source region 10 and are injected into the floating gate electrode 5. Accordingly, the effects of the first embodiment are also attainable.

Embodiment 2

FIGS. 3A through 3E are cross-sectional views illustrating respective process steps for fabricating a nonvolatile semiconductor memory device (or memory cell) according to a second embodiment of the present invention.

Figure 3A:
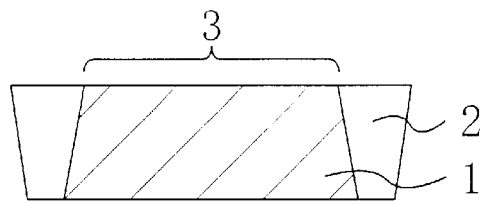
FIGS. 3A through 3E are cross-sectional views illustrating respective process steps for fabricating a nonvolatile semiconductor memory device (or memory cell) according to a second embodiment of the present invention.

First, in the process step shown in FIG. 3A, an isolation region 2 is formed in a p-type silicon substrate 1 to define an active region 3 in which a memory cell will be formed.

Figure 3B:
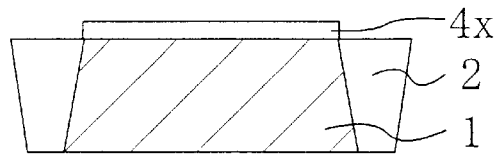

Next, in the process step shown in FIG. 3B, the surface of the active region 3 is oxidized by a known pyrolytic oxidation process, thereby forming a silicon dioxide film with a thickness of about 7 nm thereon. Subsequently, the silicon dioxide film is subjected to a lamp annealing process at 1050° C. within an $N_2O$ ambient, thereby introducing and diffusing nitrogen into the silicon dioxide film and increasing the thickness of the silicon dioxide film to 10 nm. In this manner, a nitrogen-containing silicon dioxide film 4x with a thickness of 10 nm is formed. At this time, nitrogen is non-uniformly distributed in the nitrogen-containing silicon dioxide film 4x so that the lower part of the film 4x near the substrate 1 has a relatively high nitrogen density.

Figure 3C:
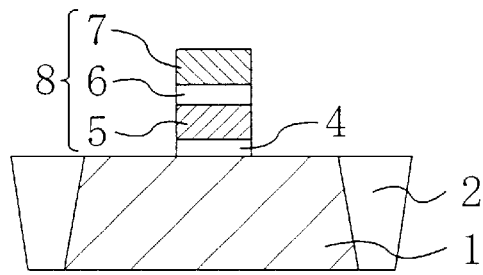

Then, in the process step shown in FIG. 3C, first polysilicon, ONO (i.e., a multilayer structure consisting of silicon dioxide, silicon nitride and silicon dioxide films) and second polysilicon films are stacked in this order on the nitrogen-containing silicon dioxide film 4x. Thereafter, a resist mask is defined thereon by a photolithographic process and then the second polysilicon, ONO, first polysilicon and nitrogen-containing silicon dioxide films are dry-etched and patterned in this order using the mask. In this manner, tunnel insulating film 4, floating gate electrode 5, interelectrode insulating film 6 of ONO and control gate electrode 7 are formed. As a result of this process step, a memory gate electrode section 8, consisting of the floating gate electrode 5, interelectrode insulating film 6 and control gate electrode 7, is formed on the tunnel insulating film 4.

Figure 3D:
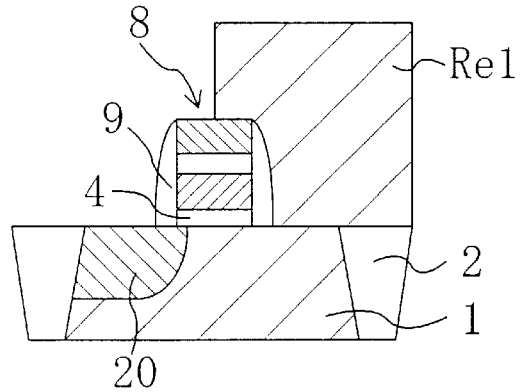

Subsequently, in the process step shown in FIG. 3D, a sidewall 9 with a thickness of about 100 nm is formed on the side faces of the memory gate electrode section 8. Thereafter, a photoresist mask Re1 is defined over the substrate to cover the right half of the memory gate electrode section 8 and a region to be the drain region. Then, using this photoresist mask Re1, memory gate electrode section 8 and sidewall 9 as a mask, arsenic ions are implanted into the substrate 1 at an accelerating voltage of about 40 keV and at a dose of about $2 \times 10^{15}$ atoms·cm$^{-3}$. Subsequently, phosphorus ions are implanted into the substrate 1 at an accelerating voltage of about 70 keV and at a dose of about $4 \times 10^{15}$ atoms·cm$^{-3}$, thereby defining a deep n-type source region 20.

Figure 3E:
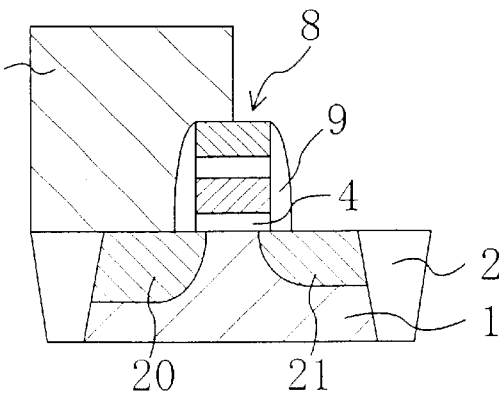

Thereafter, in the process step shown in FIG. 3E, a photoresist mask Re2 is defined over the substrate to cover the left half of the memory gate electrode section 8 and the n-type source region 20. Then, using this photoresist mask Re2, memory gate electrode section 8 and sidewall 9 as a mask, arsenic ions are implanted into the substrate 1 at an accelerating voltage of about 40 keV and at a dose of about $3 \times 10^{14}$ atoms·cm$^{-3}$, thereby defining a shallow n-type drain region 21.

FIGS. 4A and 4B are cross-sectional views illustrating how to write and erase data on/from the memory cell of the second embodiment.

As shown in FIG. 4A, in performing a write (i.e., program) operation on this memory cell, the p-type silicon substrate 1 may be grounded. And 0 V, positive intermediate voltage of 5 V and positive high voltage of +10 V may be applied to the n-type source region 20, n-type drain region 21 and control gate electrode 7, respectively. By applying these voltages, electrons flow from the n-type source region 20 into the n-type drain region 21. However, the dopant profile sharpens near the n-type drain region 21. As a result, the electrons are accelerated and collide against the atoms to create electron-hole pairs. At this time, high-velocity channel hot electrons, created near the boundary between the p-type silicon substrate 1 and n-type drain region 21, are attracted toward the floating gate electrode 5 capacitively coupled to the control gate electrode 7. Thereafter, the electrons are tunneled through part of the tunnel insulating film 4 near the n-type drain region 21 and then injected into the floating gate electrode 5. Programming is realized in this manner.

On the other hand, in performing an erase operation on this memory cell, the p-type silicon substrate 1 may be grounded and the n-type drain region 21 may be opened as shown in FIG. 4B. And 0 V and a positive high voltage of +12 V may be applied to the control gate electrode 7 and n-type source region 20, respectively. By applying these voltages, electrons, existing in the floating gate electrode 5, are attracted toward the n-type source region 20 at the positive high potential level, passed through part of the tunnel insulating film 4 near the n-type source region 20 due to the FN phenomenon and removed out of the electrode 5 into the n-type source region 20. Erasing is realized in this manner.

Alternatively, the voltages shown in FIG. 4B may be changed and a negative large voltage of −8 V and a positive low voltage of +5 V may be applied to the control gate electrode 7 and n-type source region 20, respectively. Then, electrons can also be removed out of the floating gate electrode 5 into the n-type source region 20 and the erase operation can also be performed smoothly.

In the nonvolatile semiconductor memory device (or memory cell) of the second embodiment, nitrogen, which has been diffused into the tunnel insulating film 4, is non-uniformly distributed so that the nitrogen density is relatively high in the lower part of the tunnel insulating film 4 closer to the p-type silicon substrate 1. Accordingly, that lower part of the tunnel insulating film 4 has high film quality. For that reason, while the electrons are being tunneled from the floating gate electrode 5 through the tunnel insulating film 4, the creation of defects in the lower part of the tunnel insulating film 4 near the p-type silicon substrate 1 (or n-type source region 20) can be suppressed.

In the upper part of the tunnel insulating film 4 closer to the floating gate electrode 5, charge trapping sites are newly formed because hydrogen diffuses outward as in the known nonvolatile semiconductor memory device. However, in the memory cell of the second embodiment, hot electrons, created during writing, pass through only a particular part of the tunnel insulating film 4 near the n-type drain region 21. Accordingly, holes are trapped at the charge trapping sites only in the particular part of the tunnel insulating film 4 near the n-type drain region 21 during the tunneling. That is to say, the area of that particular part of the tunnel insulating film 4 where holes are trapped is much smaller than the total area of the interface between the tunnel insulating film 4 and floating gate electrode 5. Thus, a very small quantity of electrons leaks out of the sites with the deformed band structure after holes have been trapped at the charge trapping sites. As a result, the nonvolatile semiconductor memory device (or memory cell) of the second embodiment can take advantage of the features of the channel hot electron injection method (e.g., the control circuit can be simplified). In addition, should charge trapping sites have been newly created, the decrease in the charge retention capability of the floating gate electrode 5 can be minimized.

Particularly, according to the second embodiment, the n-type drain region 21 is shallow so that a steep dopant profile is created at the pn junction. Thus, the hot electrons can be much more accelerated during writing. On the other hand, the n-type source region 20 has a so-called double drain (DD) structure because phosphorus with relatively high diffusibility and arsenic with relatively low diffusibility are both introduced thereto. Accordingly, even when a high voltage of 12 V is applied to the n-type source region 20 during erasing, the source region 20 can have its withstand voltage increased.

The effects of the first embodiment are also attainable in this second embodiment by performing a lamp annealing process to diffuse nitrogen into the tunnel insulating film 4.

Embodiment 3

FIGS. 5A through 5E are cross-sectional views illustrating respective process steps for fabricating a nonvolatile semiconductor memory device (or memory cell) according to a third embodiment of the present invention.

Figure 5A:
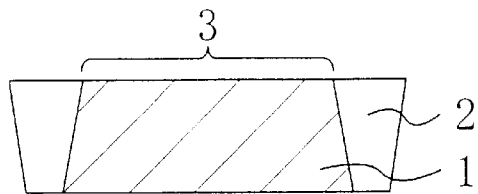
FIGS. 5A through 5E are cross-sectional views illustrating respective process steps for fabricating a nonvolatile semiconductor memory device (or memory cell) according to a third embodiment of the present invention.

First, in the process step shown in FIG. 5A, an isolation region 2 is formed in a p-type silicon substrate 1 to define an active region 3 in which a memory cell will be formed.

Figure 5B:
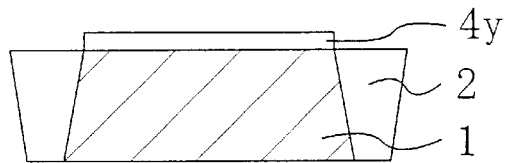

Next, in the process step shown in FIG. 5B, the surface of the active region 3 is oxidized by a known pyrolytic oxidation process, thereby forming a silicon dioxide film with a thickness of about 7 nm thereon. Subsequently, the silicon dioxide film is annealed at 950° C. within an NO ambient, thereby introducing and diffusing nitrogen into the silicon dioxide film. In this manner, a silicon oxynitride film 4y is formed. In this embodiment, the thickness of the silicon oxynitride film 4y is almost the same as that of the original silicon dioxide film unlike the first or second embodiment. However, as in the first and second embodiments, nitrogen is also non-uniformly distributed in the silicon oxynitride film 4y so that the lower part of the film 4y near the substrate 1 has a relatively high nitrogen density.

Figure 5C:
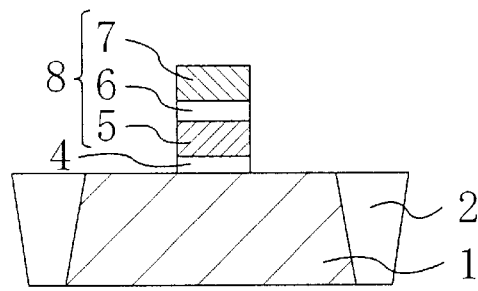

Then, in the process step shown in FIG. 5C, first polysilicon, ONO (i.e., a multilayer structure consisting of silicon dioxide, silicon nitride and silicon dioxide films) and second polysilicon films are stacked in this order on the silicon oxynitride film 4y. Thereafter, a resist mask is defined thereon by a photolithographic process and then the second polysilicon, ONO, first polysilicon and silicon oxynitride films are dry-etched and patterned in this order using the mask. In this manner, tunnel insulating film 4, floating gate electrode 5, interelectrode insulating film 6 of ONO and control gate electrode 7 are formed. As a result of this process step, a memory gate electrode section 8, consisting of the floating gate electrode 5, interelectrode insulating film 6 and control gate electrode 7, is formed on the tunnel insulating film 4.

Figure 5D:
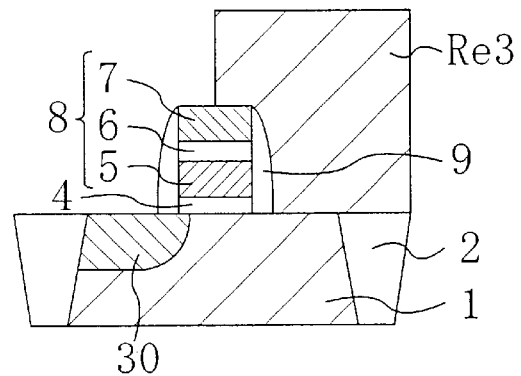

Subsequently, in the process step shown in FIG. 5D, a sidewall 9 with a thickness of about 100 nm is formed on the side faces of the memory gate electrode section 8. Thereafter, a photoresist mask Re3 is defined over the substrate to cover the right half of the memory gate electrode section 8 and a region to be the drain region. Then, using this photoresist mask Re3, memory gate electrode section 8 and sidewall 9 as a mask, arsenic ions are implanted into the substrate 1 at an accelerating voltage of about 40 keV and at a dose of about $3 \times 10^{14}$ atoms·cm$^{-3}$, thereby defining a shallow n-type source region 30.

Figure 5E:
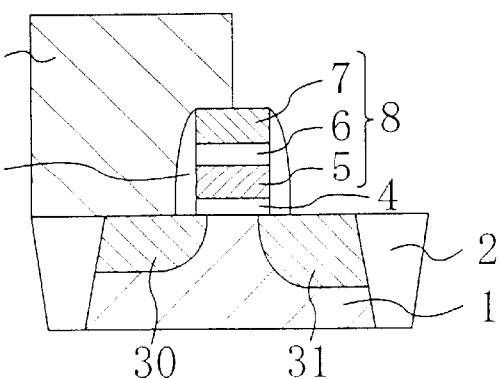

Thereafter, in the process step shown in FIG. 5E, a photoresist mask Re4 is defined over the substrate to cover the left half of the memory gate electrode section 8 and the n-type source region 30. Then, using this photoresist mask Re4, memory gate electrode section 8 and sidewall 9 as a mask, arsenic ions are implanted into the substrate 1 at an accelerating voltage of about 40 keV and at a dose of about $2 \times 10^{15}$ atoms·cm$^{-3}$. Furthermore, phosphorus ions are implanted into the substrate 1 at an accelerating voltage of about 70 keV and at a dose of about $4 \times 10^{15}$ atoms·cm$^{-3}$, thereby defining a deep n-type drain region 31.

FIGS. 6A and 6B are cross-sectional views illustrating how to write and erase data on/from the memory cell of the third embodiment.

As shown in FIG. 6A, in performing a write (i.e., program) operation on this memory cell, the p-type silicon substrate 1 may be grounded and the n-type source region 30 may be opened. And positive relatively high voltage of +6 V and negative large voltage of −8 V may be applied to the n-type drain region 31 and control gate electrode 7, respectively. By applying these voltages, electrons, existing in the floating gate electrode 5, are passed through a particular part of the tunnel insulating film 4 near the n-type drain region 31 due to the FN phenomenon and removed out of the electrode 5 into the n-type drain region 31. Programming is realized in this manner.

On the other hand, in performing an erase operation on this memory cell, the n-type drain region 31 may be opened as shown in FIG. 6B. Also, a negative large voltage of −8 V may be applied to the p-type silicon substrate 1 and n-type source region 30 and a positive high voltage of +8 V may be applied to the control gate electrode 7. By applying these voltages, electrons, existing in the p-type silicon substrate 1, are attracted toward the floating gate electrode 5 capacitively coupled to the control gate electrode 7. Thereafter, the electrons are tunneled from almost the entire channel region through almost the entire tunnel insulating film 4 due to the FN phenomenon and then injected into the floating gate electrode 5. Erasing is realized in this manner.

In the nonvolatile semiconductor memory device (or memory cell) of the third embodiment, nitrogen, which has been diffused into the tunnel insulating film 4, is non-uniformly distributed so that the nitrogen density is relatively high in the lower part of the tunnel insulating film 4 closer to the p-type silicon substrate 1. Accordingly, that lower part of the tunnel insulating film 4 has high film quality. For that reason, while the electrons are being tunneled from the p-type silicon substrate 1 through almost the entire tunnel insulating film 4, the creation of defects in the lower part of the tunnel insulating film 4 near the p-type silicon substrate 1 can be suppressed.

On the other hand, the silicon oxynitride film 4y is formed by diffusing nitrogen at about 950° C. in the process step shown in FIG. 5B. Accordingly, even in the upper part of the silicon oxynitride film 4y near the floating gate electrode 5, the creation of additional charge trapping sites resulting from the outward diffusion of hydrogen during the nitrogen diffusion process can be suppressed as will be described below.

Figure 7:
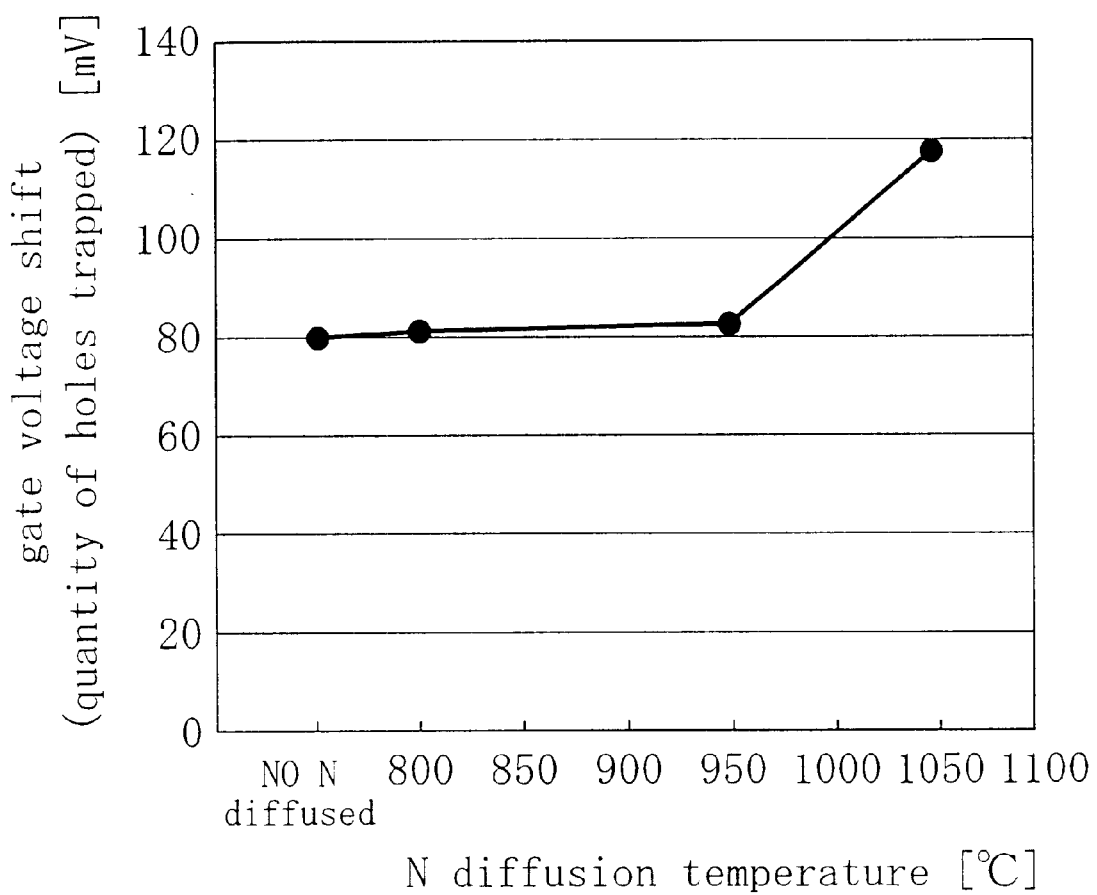
FIG. 7 is a graph illustrating how the quantity of holes trapped in the surface region of a tunnel insulating film, which is formed by patterning a silicon oxynitride film according to the third embodiment, changes with a nitrogen diffusion temperature.

FIG. 7 is a graph illustrating how the quantity of holes trapped in the surface region (i.e., near the floating gate electrode 5) of the tunnel insulating film 4, which is formed by patterning the silicon oxynitride film 4y of the third embodiment, depends on the nitrogen diffusion temperature. In FIG. 7, the abscissa represents the nitrogen diffusion temperature (° C.) while the nitrogen diffusion process is performed within the NO ambient, while the ordinate represents the gate voltage shift (mV) as an index of the quantity of holes trapped. That is to say, after a voltage has been applied to the gate electrode, the gate voltage will decrease with time and then increase again. And the shift (mV) of the local minimum from the initial value is estimated as the quantity of holes trapped. Compared to a nitrogen diffusion temperature of 1050° C., the quantity of holes trapped is much smaller at nitrogen diffusion temperatures of 950° C. or less in the nitrogen diffusion process as shown in FIG. 7. And the quantity of holes trapped at nitrogen diffusion temperatures of 950° C. or less is almost equal to that of holes trapped in a silicon dioxide film not subjected to the nitrogen diffusion process. That is to say, at the nitrogen diffusion temperatures of 950° C. or less, no charge trapping sites are newly created near the surface of the oxide film. As a result, the quantity of holes trapped when electrons are injected into the floating gate electrode 5 hardly increases compared to the silicon dioxide film not subjected to the nitrogen diffusion process. Accordingly, even if this nitrogen diffusion process is performed, the decrease in the charge retention capability of the floating gate electrode 5 can be minimized. However, to diffuse nitrogen into the silicon dioxide film effectively, the annealing should preferably be performed at 800° C. or more.

In the memory cell formed by the fabrication process of the third embodiment, even when the nitrogen diffusion process is carried out, no charge trapping sites are newly created in the tunnel insulating film 4. Accordingly, no matter what memory cell structure is used or what writing or erasing method is adopted for the memory cell, the charge retention capability thereof can be kept high. Specifically, a memory cell structure and writing and erasing methods according to any of the first, second and following embodiments are applicable to the memory cell of the third embodiment.

Also, according to the third embodiment, electrons do not have to be injected into the floating gate electrode 5 (i.e., a write or erase operation does not have to be performed) through a particular part of the tunnel insulating film 4 near the drain or source region. That is to say, by performing the annealing process at 950° C. or less within an ambient containing nitrogen, the electrons can be injected from the entire channel region in the substrate into the floating gate electrode by utilizing the FN tunneling current.

Furthermore, when the electrons are injected from the entire channel region into the floating gate electrode (i.e., a write or erase operation is performed) by utilizing the FN tunneling current as in the third embodiment shown in FIG. 6B, the electrons are injected into a region with a large area. Thus, the electrons can be injected into the floating gate electrode efficiently and the write or erase operation can be performed quickly as a result.

The memory cell of the third embodiment has a shallow n-type source region 30 and a deep n-type drain region 31. However, even a memory cell including n-type source/drain regions of an equal depth, formed by introducing an n-type dopant thereto at a time, can also attain the effects of the third embodiment if the tunnel insulating film 4 is subjected to the nitrogen diffusion process of this embodiment.

Embodiment 4

FIGS. 8A through 8E are cross-sectional views illustrating respective process steps for fabricating a nonvolatile semiconductor memory device (or memory cell) according to a fourth embodiment of the present invention.

Figure 8A:
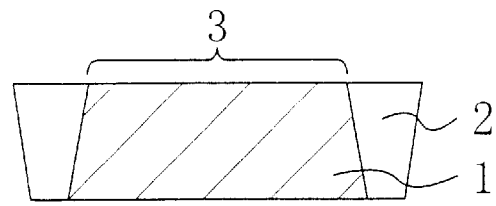
FIGS. 8A through 8E are cross-sectional views illustrating respective process steps for fabricating a nonvolatile semiconductor memory device (or memory cell) according to a fourth embodiment of the present invention.

First, in the process step shown in FIG. 8A, an isolation region 2 is formed in a p-type silicon substrate 1 to define an active region 3 in which a memory cell will be formed.

Figure 8B:
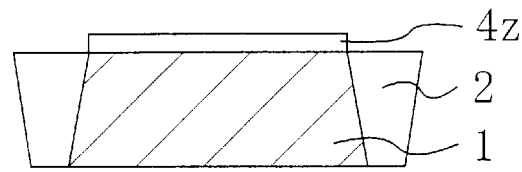

Next, in the process step shown in FIG. 8B, the surface of the active region 3 is oxidized by a known pyrolytic oxidation process, thereby forming a silicon dioxide film with a thickness of about 7 nm thereon. Subsequently, the silicon dioxide film is subjected to a lamp annealing process at 1050° C. within an $N_2O$ ambient, thereby introducing and diffusing nitrogen into the silicon dioxide film and increasing the thickness of the silicon dioxide film to 10 nm. In this manner, a nitrogen-containing silicon dioxide film 4z with a thickness of 10 nm is formed. At this time, nitrogen is non-uniformly distributed in the nitrogen-containing silicon dioxide film 4z so that the lower part of the film 4z near the substrate 1 has a relatively high nitrogen density.

Thereafter, according to the fourth embodiment, the nitrogen-containing silicon dioxide film 4z is annealed again at 750° C. within an ambient containing hydrogen and oxygen gases, thereby diffusing hydrogen into the nitrogen-containing silicon dioxide film 4z. As a result, charge trapping sites, which have just been formed through the release of hydrogen or which already existed before the nitrogen diffusion process, are inactivated in the nitrogen-containing silicon dioxide film 4z. The principal feature of the fabrication process of the fourth embodiment is this additional annealing process. In this case, the annealing process is preferably performed at a temperature between 300° C. and 950° C. within the ambient containing hydrogen and oxygen gases. This is because charge trapping sites might be newly formed at more than 950° C. and because the amount of hydrogen introduced might be insufficient at less than 300° C.

Alternatively, the annealing process may also be performed within an ambient containing fluorine, not hydrogen, so that the fluorine is diffused into the nitrogen-containing silicon dioxide film to inactivate the charge trapping sites.

Figure 8C:
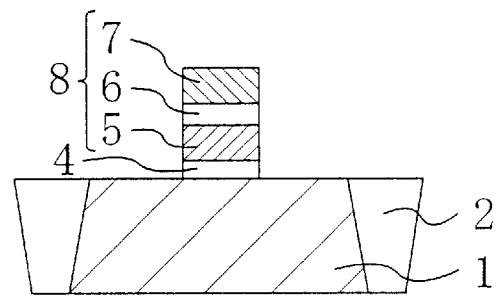

Then, in the process step shown in FIG. 8C, first polysilicon, ONO (i.e., a multilayer structure consisting of silicon dioxide, silicon nitride and silicon dioxide films) and second polysilicon films are stacked in this order on the nitrogen-containing silicon dioxide film 4z. Thereafter, a resist mask is defined thereon by a photolithographic process and then the second polysilicon, ONO, first polysilicon and nitrogen-containing silicon dioxide films are dry-etched and patterned in this order using the mask. In this manner, tunnel insulating film 4, floating gate electrode 5, interelectrode insulating film 6 of ONO and control gate electrode 7 are formed. As a result of this process step, a memory gate electrode section 8, consisting of the floating gate electrode 5, interelectrode insulating film 6 and control gate electrode 7, is formed on the tunnel insulating film 4.

Figure 8D:
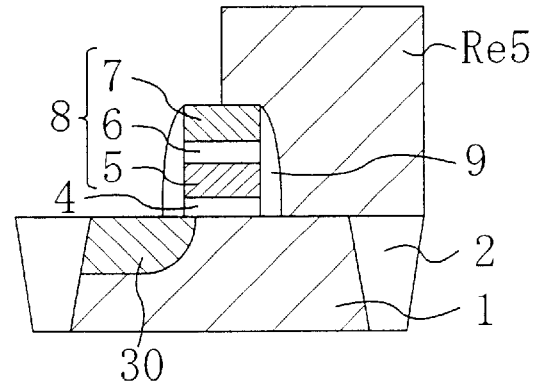

Subsequently, in the process step shown in FIG. 8D, a sidewall 9 with a thickness of about 100 nm is formed on the side faces of the memory gate electrode section 8. Thereafter, a photoresist mask Re5 is defined over the substrate to cover the right half of the memory gate electrode section 8 and a region to be the drain region. Then, using this photoresist mask Re5, memory gate electrode section 8 and sidewall 9 as a mask, arsenic ions are implanted into the substrate 1 at an accelerating voltage of about 40 keV and at a dose of about $3 \times 10^{14}$ atoms·cm$^{-3}$, thereby defining a shallow n-type source region 30.

Figure 8E:
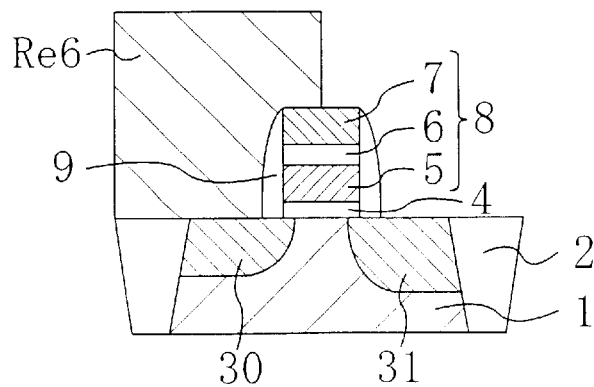
Figure 13A:
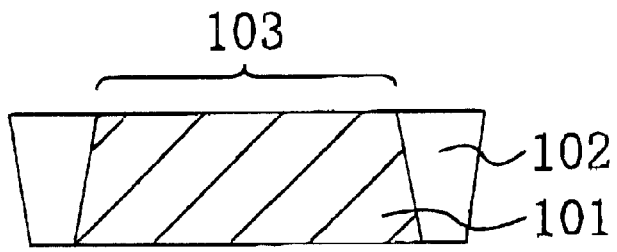
FIGS. 13A through 13D are cross-sectional views illustrating respective process steps for fabricating a known nonvolatile semiconductor memory device (or memory cell).
Figure 13B:
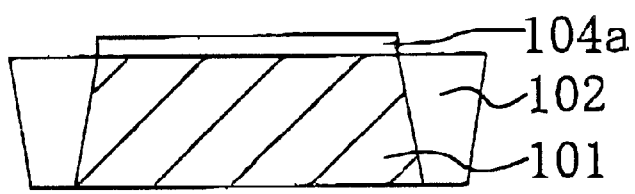
Figure 13C:
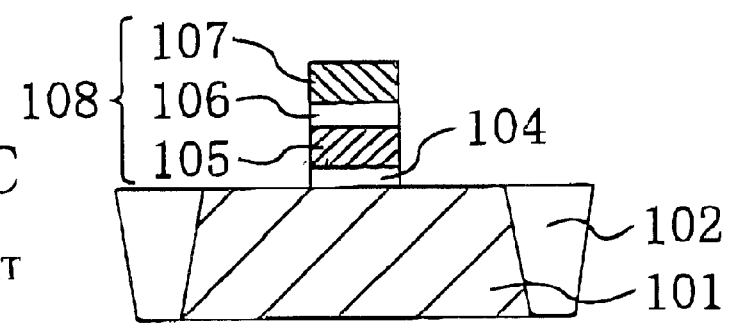
Figure 13D:
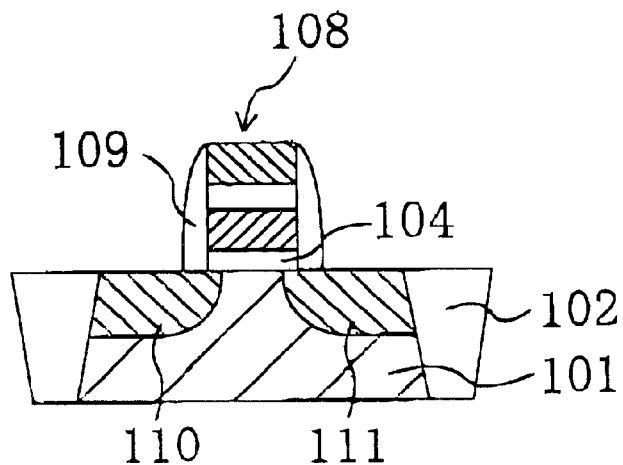
Figure 14:
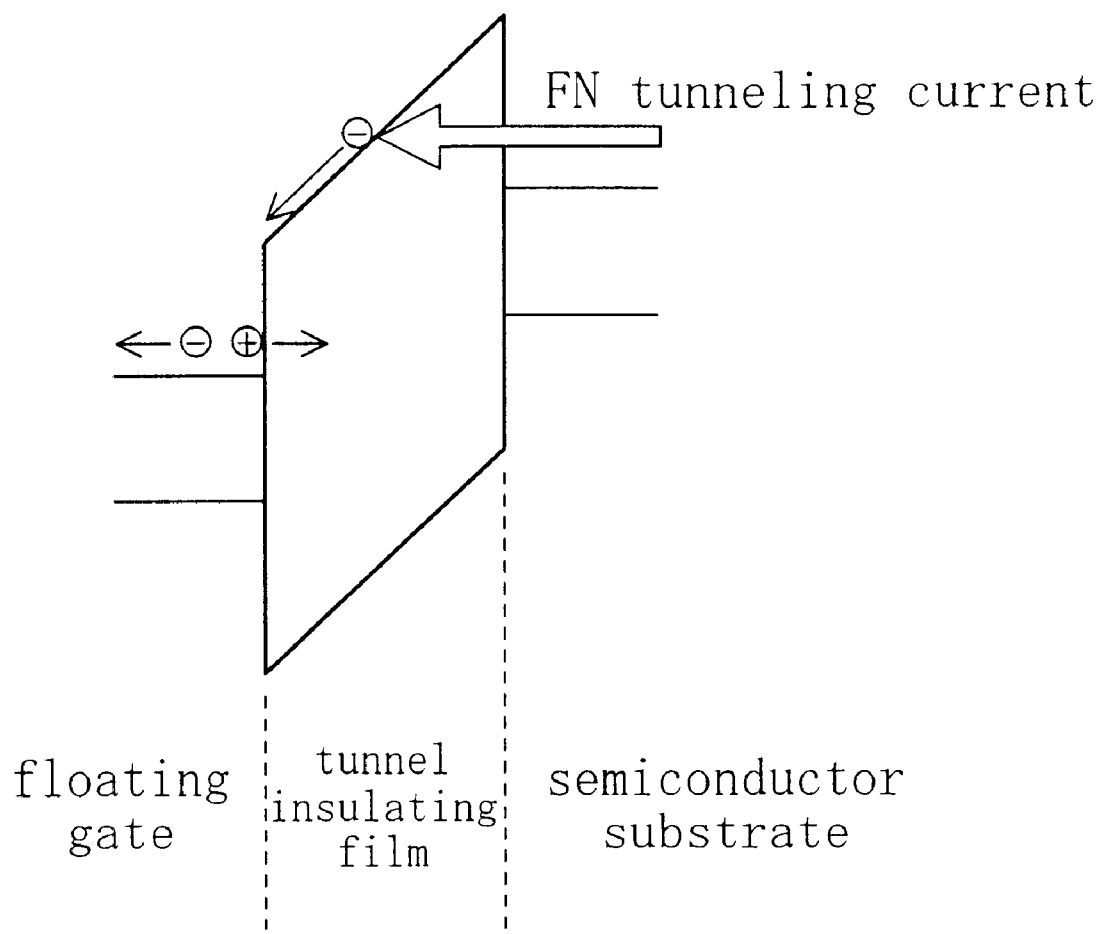
FIG. 14 is a band diagram illustrating energy band structures for a cross section passing floating gate electrode, tunnel insulating film and semiconductor substrate during the injection of electrons.
Figure 15:
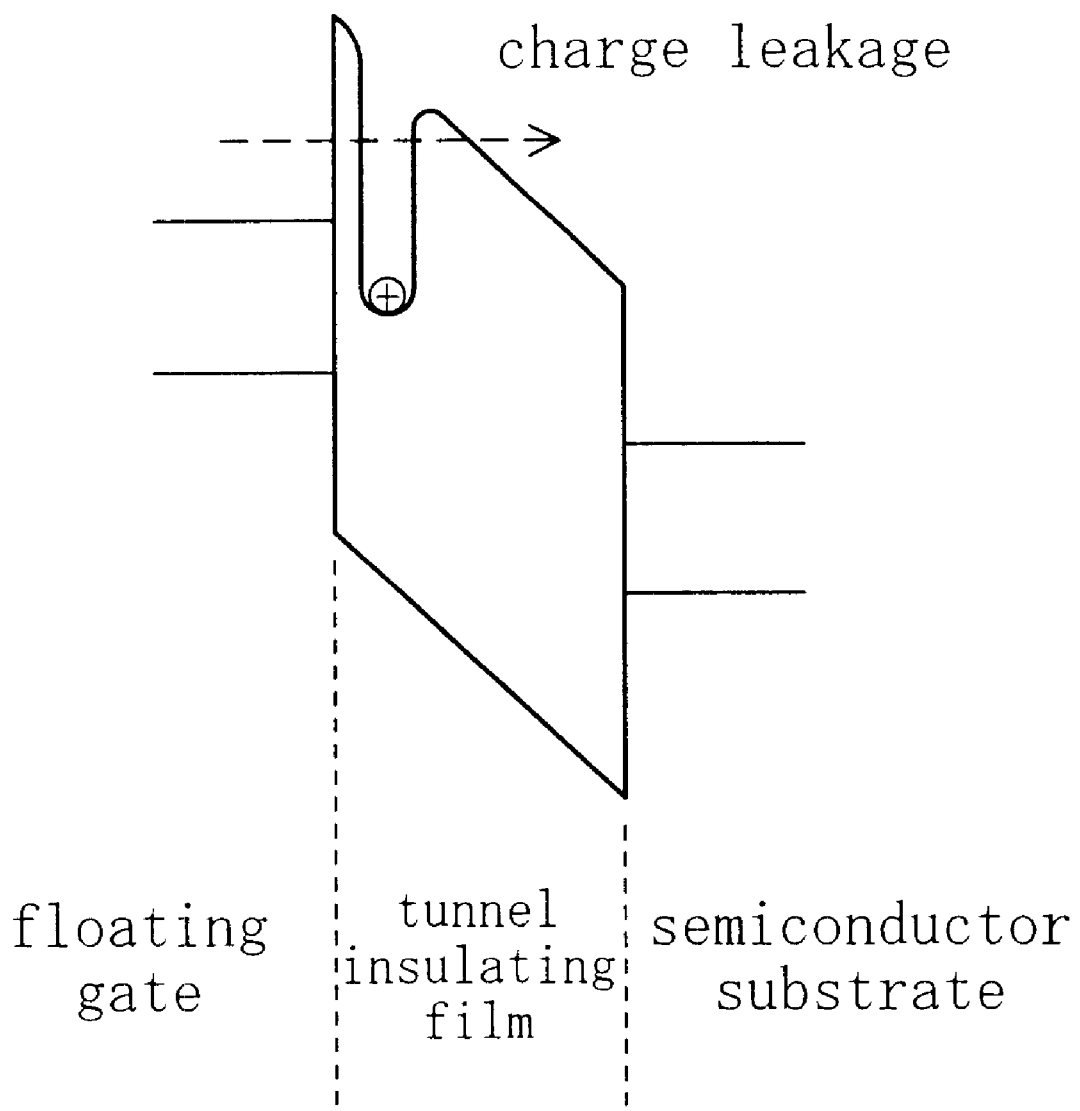
FIG. 15 is a band diagram illustrating energy band structures for the cross section passing floating gate electrode, tunnel insulating film and semiconductor substrate where holes have been trapped during a read operation, for example.

Thereafter, in the process step shown in FIG. 8E, a photoresist mask Re6 is defined over the substrate to cover the left half of the memory gate electrode section 8 and the n-type source region 30. Then, using this photoresist mask Re6, memory gate electrode section 8 and sidewall 9 as a mask, arsenic ions are implanted into the substrate 1 at an accelerating voltage of about 40 keV and at a dose of about $2 \times 10^{15}$ atoms·cm$^{-3}$. Subsequently, phosphorus ions are implanted into the substrate 1 at an accelerating voltage of about 70 keV and at a dose of about $4 \times 10^{15}$ atoms·cm$^{-3}$, thereby defining a deep n-type drain region 31.

A write or erase operation is performed as in the third embodiment on the memory cell formed by the fabrication process of the fourth embodiment, and the description thereof will be omitted herein.

In the nonvolatile semiconductor memory device (or memory cell) of the fourth embodiment, nitrogen, which has been diffused into the tunnel insulating film 4, is non-uniformly distributed so that the nitrogen density is relatively high in the lower part of the tunnel insulating film 4 closer to the p-type silicon substrate 1. Accordingly, that lower part of the tunnel insulating film 4 has high film quality. Thus while the electrons are being tunneled from the floating gate electrode 5 through the tunnel insulating film 4, the creation of defects in the lower part of the tunnel insulating film 4 near the p-type silicon substrate 1 (or the n-type drain region 31) can be suppressed.

Particularly, in the process step shown in FIG. 8B for the fabrication process of the fourth embodiment, an annealing process is performed within an ambient containing hydrogen (or fluorine). As a result, not only the charge trapping sites, which were newly formed in the upper part of the nitrogen-containing silicon dioxide film 4z near the surface due to the outward diffusion of hydrogen during the initial nitrogen diffusion process, but also other trapping sites (e.g., dangling bonds), which already existed in the silicon dioxide film before the nitrogen diffusion process, are bonded to hydrogen (or fluorine) and inactivated. That is to say, the number of charge trapping sites can be reduced even more effectively than the third embodiment. Accordingly, the quantity of holes trapped before electrons are injected into the floating gate electrode 5 can be further reduced compared to a silicon dioxide film not subjected to the nitrogen diffusion process. Consequently, the charge retention capability of the floating gate electrode 5 can be increased in this memory cell.

In the memory cell formed by the fabrication process of the fourth embodiment, even when the nitrogen diffusion process is carried out, no new charge trapping sites are newly created in the tunnel insulating film 4. Accordingly, no matter what memory cell structure is used or what writing or erasing method is adopted for the memory cell, the charge retention capability thereof can be kept high. Specifically, a memory cell structure and writing and erasing methods according to any of the first, second and following embodiments are applicable to the memory cell of the fourth embodiment.

In the fourth embodiment, the nitrogen-containing silicon dioxide film 4z is annealed at 750° C. within an ambient containing hydrogen and oxygen gases in the process step shown in FIG. 8B, thereby diffusing hydrogen into the nitrogen-containing silicon dioxide film 4z. However, the effects of the fourth embodiment are also attainable even by using any other type of ambient gas so long as the gas contains hydrogen (or fluorine). Furthermore, the effects of the fourth embodiment are also attainable even when the nitrogen-containing silicon dioxide film 4z is annealed at a temperature lower than 750° C. (e.g., 400° C.) within an ambient containing hydrogen (or fluorine) or when a plasma process is carried out within the ambient containing hydrogen (or fluorine).

Moreover, in the fourth embodiment, just after nitrogen has been introduced into the silicon dioxide film to change the film into a nitrogen-containing silicon dioxide film 4z, the nitrogen-containing silicon dioxide film 4z is annealed within an ambient containing hydrogen, thereby introducing hydrogen into the nitrogen-containing silicon dioxide film 4z. However, hydrogen may be introduced into the nitrogen-containing silicon dioxide film 4z by any other technique. For example, first, a nitrogen-containing silicon dioxide film may be formed by performing the nitrogen diffusion process at a high temperature as in the first or second embodiment. Next, hydrogen (or fluorine) is introduced in advance into a first polysilicon film to be the floating gate electrode 5. According to a technique, while the first polysilicon film is being deposited, hydrogen (or fluorine) may be introduced into the first polysilicon film. Alternatively, after the first polysilicon film has been deposited, dopant ions, including hydrogen (or fluorine) ions, may be implanted into the first polysilicon film. Thereafter, another annealing process may be performed to diffuse the hydrogen (or fluorine) from the first polysilicon film into the nitrogen-containing silicon dioxide film. Alternatively, after the memory gate electrode section 8 and tunnel insulating film 4 have been formed by patterning, another annealing process may be performed to diffuse the hydrogen (or fluorine) from the floating gate electrode 5 into the tunnel insulating film 4. In any case, the effects of the fourth embodiment are also attainable.

The memory cell of the fourth embodiment has a shallow n-type source region 30 and a deep n-type drain region 31. However, even a memory cell including n-type source/drain regions of an equal depth, formed by introducing an n-type dopant thereto at a time, can also attain the effects of the fourth embodiment if the tunnel insulating film 4 is subjected to the hydrogen (or fluorine) diffusion process of the fourth embodiment.

Modified Example of Embodiment 4

FIGS. 16A through 16E are cross-sectional views illustrating respective process steps for fabricating a nonvolatile semiconductor memory device (or memory cell) according to a modified example of the fourth embodiment.

Figure 16A:
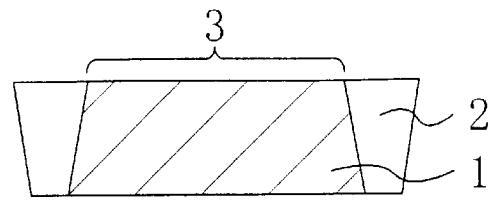
FIGS. 16A through 16E are cross-sectional views illustrating respective process steps for fabricating a nonvolatile semiconductor memory device (or memory cell) according to a modified example of the fourth embodiment.

First, in the process step shown in FIG. 16A, an isolation region 2 is formed in a p-type silicon substrate 1 to define an active region 3 in which a memory cell will be formed.

Figure 16B:
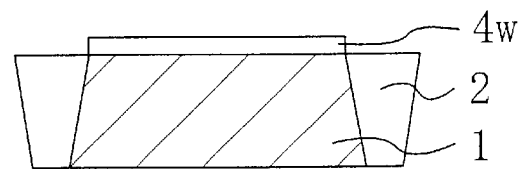

Next, in the process step shown in FIG. 16B, the surface of the active region 3 is oxidized by a known pyrolytic oxidation process, thereby forming a silicon dioxide film with a thickness of about 7 nm thereon. Subsequently, the silicon dioxide film is subjected to a lamp annealing process at 1050° C. within an $N_2O$ ambient, thereby introducing and diffusing nitrogen into the silicon dioxide film and increasing the thickness of the silicon dioxide film to 10 nm. In this manner, a nitrogen-containing silicon dioxide film 4w with a thickness of 10 nm is formed. At this time, nitrogen is non-uniformly distributed in the nitrogen-containing silicon dioxide film 4w so that the lower part of the film 4w near the substrate 1 has a relatively high nitrogen density. In this process step, if the processing temperature of the nitrogen ambient is 800° C. or more, nitrogen can be non-uniformly distributed in the nitrogen-containing silicon dioxide film 4w so that the lower part of the film 4w near the substrate 1 has a relatively high nitrogen density. However, the temperature is preferably 1200° C. or less, because charge trapping sites might be newly created if the temperature is too high.

Thereafter, according to this modified example, the nitrogen-containing silicon dioxide film 4w is subjected to another lamp annealing process at 600° C. within an ambient containing nitrogen radicals, thereby further introducing and diffusing nitrogen into the nitrogen-containing silicon dioxide film 4w. The nitrogen radicals are produced in a chamber different from the lamp annealing chamber by creating a plasma from a mixture of nitrogen and helium gases, and then introduced into the lamp annealing chamber while being activated. According to this method, the nitrogen can be diffused at a relatively low temperature and can be distributed non-uniformly in the nitrogen-containing silicon dioxide film 4w so that the upper part of the film 4w near its surface also has a relatively high nitrogen density.

Figure 17:
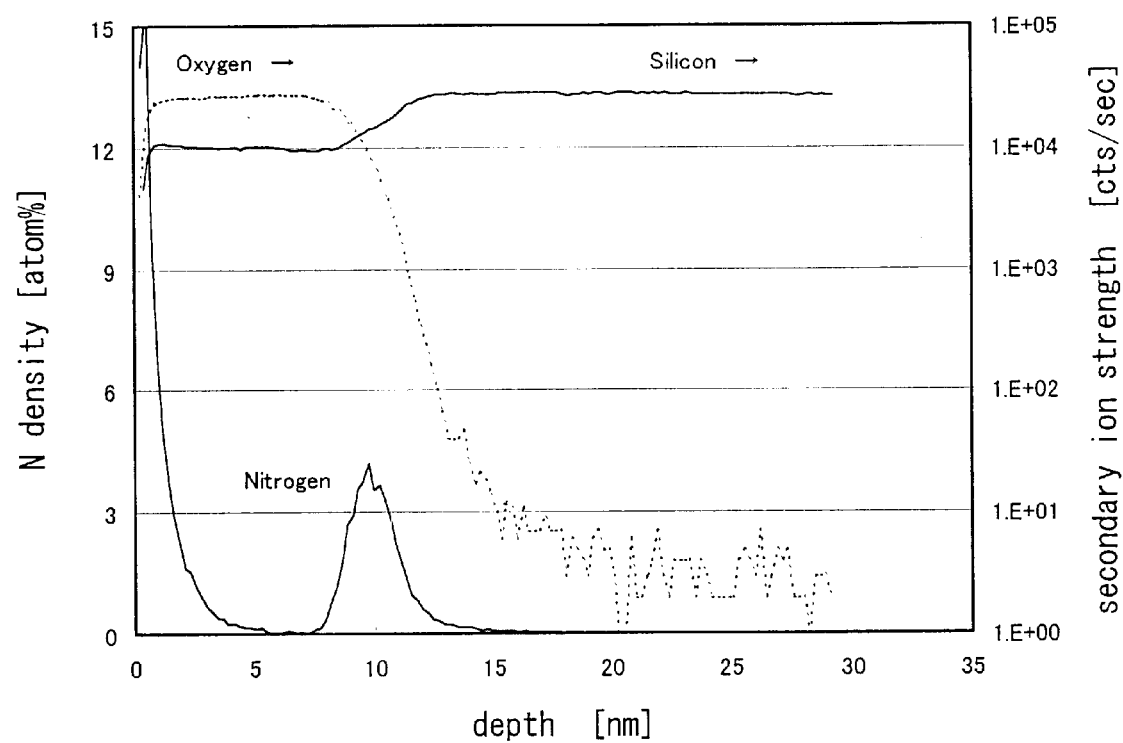
FIG. 17 is a graph illustrating a nitrogen density profile in a nitrogen-containing silicon dioxide film according to the modified example of the fourth embodiment.

FIG. 17 is a graph illustrating the nitrogen density profile in the nitrogen-containing silicon dioxide film of this modified example. As shown in FIG. 17, the nitrogen is distributed so that parts of the nitrogen-containing silicon dioxide film 4w near the silicon substrate 1 and near its own surface, respectively, have relatively high nitrogen densities. The principal feature of the fabrication process according to this modified example is performing the nitrogen diffusion processes in such a manner as to obtain such a nitrogen density profile. In this case, to obtain a nitrogen density profile like that illustrated in FIG. 17, the nitrogen diffusion process using nitrogen radicals is preferably performed at a temperature in the range from 300° C. to 800° C. This is because if the processing temperature is over 800° C., the nitrogen, which has been introduced by the nitrogen radical process, can easily diffuse inside the nitrogen-containing silicon dioxide film 4w. However, to introduce a sufficient amount of nitrogen into the surface region of the nitrogen-containing silicon dioxide film 4w by the nitrogen radical process, the temperature should be 300° C. or more.

Figure 16C:
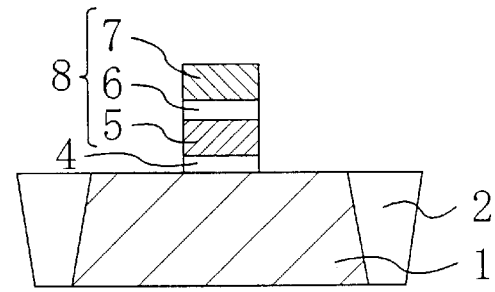

Then, in the process step shown in FIG. 16C, first polysilicon, ONO (i.e., a multilayer structure consisting of silicon dioxide, silicon nitride and silicon dioxide films) and second polysilicon films are stacked in this order on the nitrogen-containing silicon dioxide film 4w. Thereafter, a resist mask is defined thereon by a photolithographic process and then the second polysilicon, ONO, first polysilicon and nitrogen-containing silicon dioxide films are dry-etched and patterned in this order using the mask. In this manner, tunnel insulating film 4, floating gate electrode 5, interelectrode insulating film 6 of ONO and control gate electrode 7 are formed. As a result of this process step, a memory gate electrode section 8, consisting of the floating gate electrode 5, interelectrode insulating film 6 and control gate electrode 7, is formed on the tunnel insulating film 4.

Figure 16D:
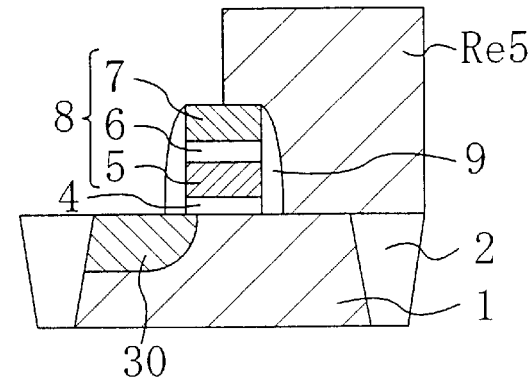

Subsequently, in the process step shown in FIG. 16D, a sidewall 9 with a thickness of about 100 nm is formed on the side faces of the memory gate electrode section 8. Thereafter, a photoresist mask Re5 is defined over the substrate to cover the right half of the memory gate electrode section 8 and a region to be the drain region. Then, using this photoresist mask Re5, memory gate electrode section 8 and sidewall 9 as a mask, arsenic ions are implanted into the substrate 1 at an accelerating voltage of about 40 keV and at a dose of about $3 \times 10^{14}$ atoms·cm$^{-3}$, thereby defining a shallow n-type source region 30.

Figure 16E:
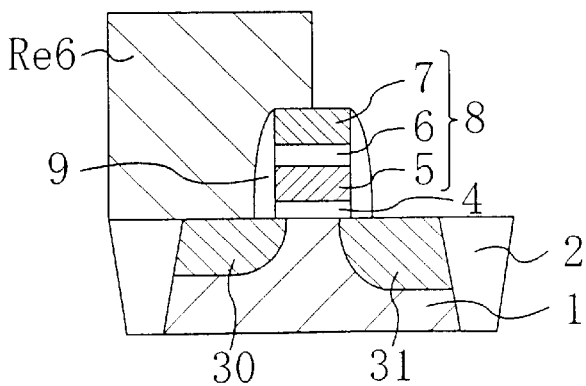

Thereafter, in the process step shown in FIG. 16E, a photoresist mask Re6 is defined over the substrate to cover the left half of the memory gate electrode section 8 and the n-type source region 30. Then, using this photoresist mask Re6, memory gate electrode section 8 and sidewall 9 as a mask, arsenic ions are implanted into the substrate 1 at an accelerating voltage of about 40 keV and at a dose of about $2 \times 10^{15}$ atoms·cm$^{-3}$. Subsequently, phosphorus ions are implanted into the substrate 1 at an accelerating voltage of about 70 keV and at a dose of about $4 \times 10^{15}$ atoms·cm$^{-3}$, thereby defining a deep n-type drain region 31.

A write or erase operation is performed as in the third embodiment on the memory cell formed by the fabrication process of this modified example, and the description thereof will be omitted herein.

In the nonvolatile semiconductor memory device (or memory cell) of this modified example, nitrogen, which has been diffused into the tunnel insulating film 4, is non-uniformly distributed so that the nitrogen density is relatively high in the lower part of the tunnel insulating film 4 closer to the p-type silicon substrate 1. Accordingly, that lower part of the tunnel insulating film 4 has high film quality. Thus while the electrons are being tunneled from the floating gate electrode 5 through the tunnel insulating film 4, the creation of defects in the lower part of the tunnel insulating film 4 near the p-type silicon substrate 1 (or the n-type drain region 31) can be suppressed. Furthermore, in this modified example, a lamp annealing process is performed at 600° C. within an ambient containing nitrogen radicals so that the nitrogen is also densely distributed in the upper part of the tunnel insulating film 4 near its own surface. Accordingly, even if charge trapping sites have been newly formed in the upper part of the tunnel insulating film 4 near its surface by the outward diffusion of hydrogen before the lamp annealing process is performed at 600° C. within the ambient containing nitrogen radicals, those trapping sites can be inactivated. In addition, compared to the fourth embodiment, those additionally introduced nitrogen atoms can further reduce the quantity of holes trapped while electrons are injected into the floating gate electrode 5.

The memory cell of this modified example has a shallow n-type source region 30 and a deep n-type drain region 31. However, even a memory cell including n-type source/drain regions of an equal depth, formed by introducing an n-type dopant thereto at a time, can also attain the effects of this modified example if the tunnel insulating film 4 is subjected to the nitrogen diffusion process as the lamp annealing process within the nitrogen radical ambient according to this modified example.

In the memory cell formed by the fabrication process of this modified example, even when the nitrogen diffusion process is carried out, no charge trapping sites are newly created in the tunnel insulating film 4. Accordingly, no matter what memory cell structure is used or what writing or erasing method is adopted for the memory cell, the charge retention capability thereof can be kept high. Specifically, a memory cell structure and writing and erasing methods according to any of the first, second and following embodiments are applicable to the memory cell of this modified example.

Embodiment 5

FIGS. 9A and 9B are cross-sectional views illustrating a structure for a nonvolatile semiconductor memory device (or memory cell) according to a fifth embodiment of the present invention and how to write or erase data on/from the memory cell. As for this embodiment, the fabrication process of the memory cell will not be described. It should be noted, however, that the tunnel insulating film TI is formed through the process of the third or fourth embodiment.

As shown in FIG. 9A, in performing a write (or program) operation on this memory cell, the silicon substrate SUB may be grounded, the source/drain regions S and D may be opened and a positive high voltage of +16 V may be applied to the control gate electrode CG. By applying these voltages, electrons, existing in the silicon substrate SUB, are tunneled from almost the entire channel region through almost the entire tunnel insulating film TI due to the FN phenomenon and then injected into the floating gate electrode FG. In this manner, the write (program) operation is realized.

On the other hand, in performing an erase operation on this memory cell, the source/drain regions S and D may be opened, a positive high voltage of +18 V may be applied to the silicon substrate SUB and the control gate electrode CG may be grounded. By applying these voltages, electrons, existing in the floating gate electrode FG capacitively coupled to the control gate electrode CG, are tunneled through almost the entire tunnel insulating film TI due to the FN phenomenon and then removed into almost the entire channel region of the silicon substrate SUB. In this manner, the erase operation is realized.

In this embodiment, the write and erase operations are both performed by tunneling electrons through almost the entire tunnel insulating film TI by utilizing the FN phenomenon. Accordingly, programming can be performed with reduced power dissipation. In addition, the memory cell of this embodiment can be highly reliable, because the nitrogen diffusion process has already eliminated charge trapping sites from the tunnel insulating film TI or the subsequent hydrogen (or fluorine) diffusion process has drastically reduced the number of charge trapping sites. Accordingly, not the fabrication process of the first or second embodiment, but the low-temperature nitrogen diffusion process of the third embodiment or the nitrogen and hydrogen (or fluorine) diffusion processes of the fourth embodiment is applicable to the memory cell having the structure and write and erase methods of the fifth embodiment. It should be noted, however, that the source/drain regions may be of an equal depth and may be formed at a time by an ion implantation process.

Embodiment 6

FIGS. 10A and 10B are cross-sectional views illustrating a structure for a nonvolatile semiconductor memory device (or memory cell) according to a sixth embodiment of the present invention and how to write or erase data on/from the memory cell. As for this embodiment, the fabrication process of the memory cell will not be described. It should be noted, however, that the tunnel insulating film TI is formed through the process of the third or fourth embodiment. Also, according to this embodiment, not only the floating and control gate electrodes FG and CG but also a select gate electrode SG are provided.

As shown in FIG. 10A, in performing a write (or program) operation on this memory cell, the silicon substrate SUB may be grounded and the source region S may be opened. Also, a voltage of 0 V may be applied to the select gate electrode SG and drain region D and a positive high voltage of +11 V may be applied to the control gate electrode CG. By applying these voltages, electrons, existing in the silicon substrate SUB, are tunneled from almost the entire channel region through almost the entire tunnel insulating film TI due to the FN phenomenon and then injected into the floating gate electrode FG. In this manner, the write (program) operation is realized.

On the other hand, in performing an erase operation on this memory cell, the source/drain regions S and D may be opened. Also, positive high voltage of +8 V, positive low voltage of 2.5 V and negative large voltage of −7 V may be applied to the silicon substrate SUB, select gate electrode SG and control gate electrode CG, respectively, as shown in FIG. 10B. By applying these voltages, electrons, existing in the floating gate electrode FG capacitively coupled to the control gate electrode CG, are tunneled through almost the entire tunnel insulating film TI due to the FN phenomenon and then removed into almost the entire channel region of the silicon substrate SUB. In this manner, the erase operation is realized.

In this embodiment, the write and erase operations are also both performed by tunneling electrons through almost the entire tunnel insulating film TI by utilizing the FN phenomenon. Accordingly, the effects of the fifth embodiment are also attainable. In addition, the memory cell of this embodiment can be highly reliable, because the nitrogen diffusion process has already eliminated charge trapping sites from the tunnel insulating film TI or the subsequent hydrogen (or fluorine) diffusion process has drastically reduced the number of charge trapping sites. Accordingly, not the fabrication process of the first or second embodiment, but the low-temperature nitrogen diffusion process of the third embodiment or the nitrogen and hydrogen (or fluorine) diffusion processes of the fourth embodiment is applicable to the memory cell having the structure and write and erase methods of the fifth embodiment. It should be noted, however, that the source/drain regions may be of an equal depth and may be formed at a time by an ion implantation process.

Embodiment 7

FIGS. 11A and 11B are cross-sectional views illustrating a structure for a nonvolatile semiconductor memory device (or memory cell) according to a seventh embodiment of the present invention and how to write or erase data on/from the memory cell. As for this embodiment, the fabrication process of the memory cell will not be described. It should be noted, however, that the tunnel insulating film TI is formed through the process of the third embodiment, the process of the fourth embodiment or the hydrogen (or fluorine) diffusion process alone. Also, the memory cell of the seventh embodiment has a so-called "split gate" structure. Specifically, the control and floating gate electrodes CG and FG are both located over the channel region, the floating gate electrode FG overlaps the channel region and drain region D and the control gate electrode CG overlaps the channel region and source region S. And an interelectrode insulating film EI between the floating and control gate electrodes FG and CG functions as a tunnel insulating film during an erase operation. Also, the memory cell of the seventh embodiment has a shallow source region S and a deep drain region D that have been formed by the process of the third or fourth embodiment.

As shown in FIG. 11A, in performing a write (or program) operation on this memory cell, the silicon substrate SUB may be grounded. Also, voltage of 0 V, positive high voltage of +12 V and positive low voltage of +2 V may be applied to the source region S, drain region D and control gate electrode CG, respectively. By applying these voltages, electrons, flowing from the source region S toward the drain region D, are attracted toward the floating gate electrode FG capacitively coupled to the control gate electrode CG. Then, the electrons are tunneled from the channel region through the tunnel insulating film TI and then injected into the floating gate electrode FG. In this manner, the write (program) operation is realized.

On the other hand, in performing an erase operation on this memory cell, the silicon substrate SUB may be grounded. Also, a voltage of 0 V may be applied to the source/drain regions S and D and a positive high voltage of +14 V may be applied to the control gate electrode CG as shown in FIG. 11B. By applying these voltages, electrons, existing in the floating gate electrode FG, are attracted toward the control gate electrode CG at the high potential level, tunneled through the interelectrode insulating film EI due to the FN phenomenon and then removed into the control gate electrode CG. In this manner, the erase operation is realized.

In this embodiment, the write operation is performed by tunneling electrons through the tunnel insulating film TI. Accordingly, high reliability is realized whether the tunnel insulating film TI is formed by subjecting a silicon dioxide film to the hydrogen (or fluorine) diffusion process alone (i.e., without the nitrogen diffusion process) or by subjecting the silicon dioxide film to the nitrogen diffusion process and then to the hydrogen (or fluorine) diffusion process in combination (i.e., as in the method of the fourth embodiment). This is because with any of these options, the number of charge trapping sites existing in the tunnel insulating film can be reduced and the charge retention capability of the floating gate electrode FG improves. However, even if the low-temperature nitrogen diffusion process of the third embodiment is performed, the nitrogen diffusion process can also suppress the creation of additional charge trapping sites. As a result, the nitrogen diffusion process can also improve the quality of the tunnel insulating film TI and prevent the charge retention capability of the floating gate electrode FG from decreasing.

Embodiment 8

FIGS. 12A and 12B are cross-sectional views illustrating a structure for a nonvolatile semiconductor memory device (or memory cell) according to an eighth embodiment of the present invention and how to write or erase data on/from the memory cell. As for this embodiment, the fabrication process of the memory cell will not be described. It should be noted, however, that the tunnel insulating film TI is formed through the process of the third embodiment, the process of the fourth embodiment or the hydrogen (or fluorine) diffusion process alone. Also, the memory cell of the eighth embodiment has a so-called "split gate" structure. Specifically, the control and floating gate electrodes CG and FG are both located over the channel region, the floating gate electrode FG overlaps the channel region and drain region D and the control gate electrode CG overlaps the channel region and source region S. The memory cell of the eighth embodiment further includes an erase gate electrode EG and an interelectrode insulating film ERI between the floating and erase gate electrodes FG and EG functions as a tunnel insulating film during an erase operation. Also, the memory cell of the eighth embodiment has a shallow source region S and a deep drain region D that have been formed by the process of the first embodiment.

As shown in FIG. 12A, in performing a write (or program) operation on this memory cell, the silicon substrate SUB may be grounded and the erase gate electrode EG may be opened. Also, voltage of 0 V, positive intermediate voltage of +5 V and positive high voltage of +10 V may be applied to the source region S, drain region D and control gate electrode CG, respectively. By applying these voltages, hot electrons are created from the electrons flowing from the source region S toward the drain region D through the action as described for the second embodiment. Then, the hot electrons are attracted toward the floating gate electrode FG capacitively coupled to the control gate electrode CG. And the electrons are tunneled from the channel region through the tunnel insulating film TI and then injected into the floating gate electrode FG. In this manner, the write (program) operation is realized.

On the other hand, in performing an erase operation on this memory cell, the silicon substrate SUB and control gate electrode CG may be grounded and the source/drain regions S and D may be opened. Also, a positive high voltage of +12 V may be applied to the erase gate electrode EG as shown in FIG. 12B. By applying these voltages, electrons, existing in the floating gate electrode FG, are attracted toward the erase gate electrode EG at the high potential level, tunneled through the interelectrode insulating film ERI due to the FN phenomenon and then removed into the erase gate electrode EG. In this manner, the erase operation is realized.

In this embodiment, the write operation is performed by tunneling electrons through the tunnel insulating film TI. Accordingly, the tunnel insulating film TI is formed by subjecting a silicon dioxide film to the hydrogen (or fluorine) diffusion process alone (i.e., without the nitrogen diffusion process) or to the nitrogen diffusion process and then the hydrogen (or fluorine) diffusion process in combination (i.e., as in the method of the fourth embodiment). With any of these options, the number of charge trapping sites existing in the tunnel insulating film can be reduced and the charge retention capability of the floating gate electrode FG improves. However, even if the low-temperature nitrogen diffusion process of the third embodiment is performed, the nitrogen diffusion process can also suppress the creation of additional charge trapping sites. As a result, the nitrogen diffusion process can also improve the quality of the tunnel insulating film TI and prevent the charge retention capability of the floating gate electrode FG from decreasing.

What is claimed is:

1. A method for fabricating a nonvolatile semiconductor memory device in which electrons are injected from a drain end or a source end into a floating gate electrode in a method of injecting hot electrons created by a band-to-band tunneling current, comprising the steps of:

a) forming a silicon dioxide film on an n-type semiconductor region by performing an annealing process within an ambient containing oxygen and hydrogen, the n-type semiconductor region being located in a substrate;

b) diffusing nitrogen into the silicon dioxide film by annealing the silicon dioxide film within an ambient containing nitrogen;

c) forming a memory gate electrode section, which includes a floating gate electrode, an interelectrode insulating film and a control gate electrode, on the silicon dioxide film after the step b) has been performed; and d) defining two p-type doped regions by introducing a p-type dopant into two parts of the n-type semiconductor region that are located on right- and left-hand sides of the floating gate electrode.

2. A method for fabricating a nonvolatile semiconductor memory device in which electrons are injected from a drain end or a source end into a floating gate electrode in a channel hot electron injection method, comprising the steps of:

a) forming a silicon dioxide film on a p-type semiconductor region by performing an annealing process within an ambient containing oxygen and hydrogen, the p-type semiconductor region being located in a substrate;

b) diffusing nitrogen into the silicon dioxide film by annealing the silicon dioxide film within an ambient containing nitrogen;

c) forming a memory gate electrode section, which includes a floating gate electrode, an interelectrode insulating film and a control gate electrode, on the silicon dioxide film after the step b) has been performed; and d) defining two n-type doped regions by introducing an n-type dopant into two parts of the p-type semiconductor region that are located on right- and left-hand sides of the floating gate electrode, where a dopant profile in a transition region between the p-type semiconductor region and one of the n-type doped regions is different from a dopant profile in a transition region between the p-type semiconductor region and the other n-type doped region.

3. A method for fabricating a nonvolatile semiconductor memory device in which electrons are injected from almost the entire channel region into a floating gate electrode in an FN tunneling method, comprising the steps of:

a) forming a silicon dioxide film on a semiconductor region by performing an annealing process within an ambient containing oxygen and hydrogen, the semiconductor region being located in a substrate;

b) diffusing nitrogen into the silicon dioxide film by annealing the silicon dioxide film at a temperature between 800° C. and 950° C. within an ambient containing nitrogen;

c) forming a memory gate electrode section, which includes a floating gate electrode, an interelectrode insulating film and a control gate electrode, on the silicon dioxide film after the step b) has been performed; and d) defining two doped regions by introducing a dopant into two parts of the semiconductor region that are located on right- and left-hand sides of the floating gate electrode, the doped regions having a conductivity type opposite to a conductivity type of the semiconductor region.

4. A method for fabricating a nonvolatile semiconductor memory device, comprising the steps of:
   a) forming a silicon dioxide film on a semiconductor region by performing an annealing process within an ambient containing oxygen and hydrogen, the semiconductor region being located in a substrate;
   b) diffusing hydrogen into the silicon dioxide film by annealing the silicon dioxide film within an ambient containing hydrogen;
   c) forming a memory gate electrode section, which includes a floating gate electrode, an interelectrode insulating film and a control gate electrode, on the silicon dioxide film after the step b) has been performed; and
   d) defining two doped regions by introducing a dopant into two parts of the semiconductor region that are located on right- and left-hand sides of the floating gate electrode, the doped regions having a conductivity type opposite to a conductivity type of the semiconductor region.

5. The method of claim 4, further comprising the step of diffusing nitrogen into the silicon dioxide film by annealing the silicon dioxide film within an ambient containing nitrogen between the steps a) and c).

6. The method of claim 4, wherein in the step b), the silicon dioxide film is annealed at a temperature between 300° C. and 950° C.

7. A method for fabricating a nonvolatile semiconductor memory device, comprising the steps of:
   a) forming a silicon dioxide film on a semiconductor region by performing an annealing process within an ambient containing oxygen and hydrogen, the semiconductor region being located in a substrate;
   b) diffusing nitrogen into the vicinity of an interface between the silicon dioxide film and the substrate by annealing the silicon dioxide film at a temperature between 800° C. and 1200° C. within an ambient containing nitrogen;
   c) diffusing nitrogen into a surface region of the silicon dioxide film by annealing the silicon dioxide film at a temperature between 300° C. and 800° C. within an ambient containing nitrogen radicals;
   d) forming a memory gate electrode section, which includes a floating gate electrode, an interelectrode insulating film and a control gate electrode, on the silicon dioxide film after the step c) has been performed; and
   e) defining two doped regions by introducing a dopant into two parts of the semiconductor region that are located on right- and left-hand sides of the floating gate electrode, the doped regions having a conductivity type opposite to a conductivity type of the semiconductor region.

* * * * *